United States Patent
Srinivasan et al.

(10) Patent No.: US 11,196,269 B2
(45) Date of Patent: Dec. 7, 2021

(54) BATTERY CELL PROTECTION SYSTEM

(71) Applicant: The Johns Hopkins University, Baltimore, MD (US)

(72) Inventors: Rengaswamy Srinivasan, Ellicott City, MD (US); Bliss G. Carkhuff, Laurel, MD (US)

(73) Assignee: The Johns Hopkins University, Baltimore, MD (US)

( * ) Notice: Subject to any disclaimer, the term of this patent is extended or adjusted under 35 U.S.C. 154(b) by 231 days.

(21) Appl. No.: 16/502,217

(22) Filed: Jul. 3, 2019

(65) Prior Publication Data

US 2020/0014220 A1 Jan. 9, 2020

Related U.S. Application Data

(60) Provisional application No. 62/694,063, filed on Jul. 5, 2018.

(51) Int. Cl.
| | |
|---|---|
| *H02J 7/00* | (2006.01) |
| *H01M 10/48* | (2006.01) |
| *H01M 10/613* | (2014.01) |
| *H01M 10/0525* | (2010.01) |
| *H01M 10/42* | (2006.01) |

(52) U.S. Cl.
CPC ....... *H02J 7/0021* (2013.01); *H01M 10/0525* (2013.01); *H01M 10/48* (2013.01); *H01M 10/613* (2015.04); *H02J 7/0029* (2013.01); *H01M 2010/4271* (2013.01)

(58) Field of Classification Search
USPC .......................................................... 320/134
See application file for complete search history.

(56) References Cited

U.S. PATENT DOCUMENTS

| | | | |
|---|---|---|---|
| 2013/0264999 A1* | 10/2013 | Srinivasan .......... | H01M 50/572 320/107 |
| 2015/0288213 A1* | 10/2015 | van Lammeren ..... | H02J 7/0077 320/153 |
| 2017/0149256 A1* | 5/2017 | Srinivasan .......... | H01M 10/486 |
| 2020/0014220 A1* | 1/2020 | Srinivasan .......... | H01M 10/425 |

* cited by examiner

*Primary Examiner* — Mohammed Alam
(74) *Attorney, Agent, or Firm* — Sung T. Kim

(57) ABSTRACT

A battery cell evaluation apparatus is provided that includes a current source configured to output a current at a frequency, measurement circuitry, and control circuitry. The control circuitry may be configured to electrically connect a cell of a battery to the current source and the measurement circuitry to apply the current across terminals of the cell and receive a measurement of an impedance phase shift of the cell as phase shift data from the measurement circuitry. The control circuitry may also be configured to compare the phase shift data to a protection profile, and trigger a protection device to prevent damage to the battery based on the comparison of the phase shift data to the protection profile.

20 Claims, 11 Drawing Sheets

BATTERY CELL PROTECTION SYSTEM

CROSS-REFERENCE TO RELATED APPLICATIONS

This application claims the benefit of U.S. Provisional Application No. 62/694,063 filed on Jul. 5, 2018, the entire contents of which are hereby incorporated herein by reference.

TECHNICAL FIELD

Example embodiments generally relate to battery technology and, in particular, relate to the evaluation of battery cells in order to take protective action.

BACKGROUND

Lithium-ion (Li-ion) cells and batteries of Li-ion cells differ uniquely from other electrochemical devices. The distinctively higher cell voltages, energy and power densities, and longer cycle and shelf lives have made Li-ion batteries an essential component in almost all aspects of current human activity on Earth and in space. Today Li-ion batteries are found in, for example, electric vehicles, power grids, miners' headlights, power tools, robots, drones, and surgical tools. In space, virtually every spacecraft launched since 2003 contains Li-ion batteries as the main source of power. When compared to energy sources, such as, for example, gasoline, Li-ion batteries are superior due to the ability to release energy repeatedly for more than one thousand cycles, while gasoline stores and subsequently releases chemical energy only once.

While Li-ion batteries have proven to be highly effective by bringing many benefits in a variety of applications, Li-ion and other lithium-based batteries still have drawbacks. One drawback is that such batteries, particularly batteries having large numbers of cells, can require a management system to monitor the cells to ensure proper operation and to detect potential issues with the cells. Monitoring the condition of the cells is often necessary because cell failure, and in particular single cell failure, can lead to combustion of the battery due to intense heat caused by the failure. When a cell begins to fail, the temperature and pressure within the cell can increase until venting occurs, where gases within the canister of the cell are expelled from a pressure sensitive venting feature on the canister. Heating of the cell can continue even after venting until a thermal runaway event occurs where the gases and the materials within the cell ultimately ignite. Such heating may be caused by a rise in temperature of the cell caused by another heat source, overcharging of the cell, fast charging and fast discharging of the cell, excessively high current draw due to, for example, a short circuit external or internal to the cell, or the like. Because the cells are often in close physical proximity to each other, the heat generated by a single failing cell can cause heating and failure of adjacent, otherwise "healthy" cells, ultimately causing the adjacent cells to fail as well, leading to a cascading effect of cell failures within a battery.

As such, many battery management systems attempt to monitor the cells of a battery to prevent such thermal runaway events. For example, some battery management systems directly monitor the surface temperature of each cell of a battery using, for example, individual thermocouples that are affixed to each of the cells. However, simply monitoring surface temperature has not proven to be a completely effective approach for battery cell monitoring and protection, and the inclusion of thermocouples on each of the cells adds difficulty to battery assembly and increases cost.

BRIEF SUMMARY OF SOME EXAMPLES

According to some example embodiments, a battery cell evaluation apparatus is provided comprising a current source configured to output a current at a frequency, measurement circuitry, and control circuitry. The control circuitry may be configured to electrically connect a cell of a battery to the current source and the measurement circuitry to apply the current across terminals of the cell and receive a measurement of an impedance phase shift of the cell as phase shift data from the measurement circuitry. In this regard, the measurement circuitry may be configured to measure, due to application of the current, the impedance phase shift between the current and a voltage across the terminals of the cell at the frequency. The control circuitry may be further configured to compare the phase shift data to a protection profile and trigger a protection device to prevent damage to the battery based on the comparison of the phase shift data to the protection profile.

According to some example embodiments, a system is provided comprising a battery comprising a cell within a plurality of cells, and a battery cell evaluation apparatus. The battery cell evaluation apparatus may comprise a current source configured to output a current, measurement circuitry, and control circuitry. The control circuitry may be configured to electrically connect the cell of the battery to the current source and the measurement circuitry to apply the current across terminals of the cell and receive a measurement of an impedance phase shift of the cell as phase shift data from the measurement circuitry. In this regard, the measurement circuitry may be configured to measure, due to application of the current, the impedance phase shift between the current and a voltage across the terminals of the cell. The control circuitry may be further configured to compare the phase shift data to a protection profile and trigger a protection device to prevent damage to the battery based on the comparison of the phase shift data to the protection profile.

According to some example embodiments, an example method is provided comprising electrically connecting a cell of a battery to a current source and measurement circuitry to apply a current across terminals of the cell, and receiving, at control circuitry, repeated measurements of an impedance phase shift of the cell over time as phase shift data from the measurement circuitry. In this regard, the measurement circuitry may be configured to measure, due to application of the current, the impedance phase shift between the current and a voltage across the terminals of the cell. Further, the example method may also comprise comparing the phase shift data to a protection profile and triggering a protection device to prevent damage to the battery based on the comparison of the phase shift data to the protection profile.

BRIEF DESCRIPTION OF THE SEVERAL VIEWS OF THE DRAWING(S)

Having thus described some embodiments in general terms, reference will now be made to the accompanying drawings, which are not necessarily drawn to scale, and wherein:

DETAILED DESCRIPTION

Figure 1:
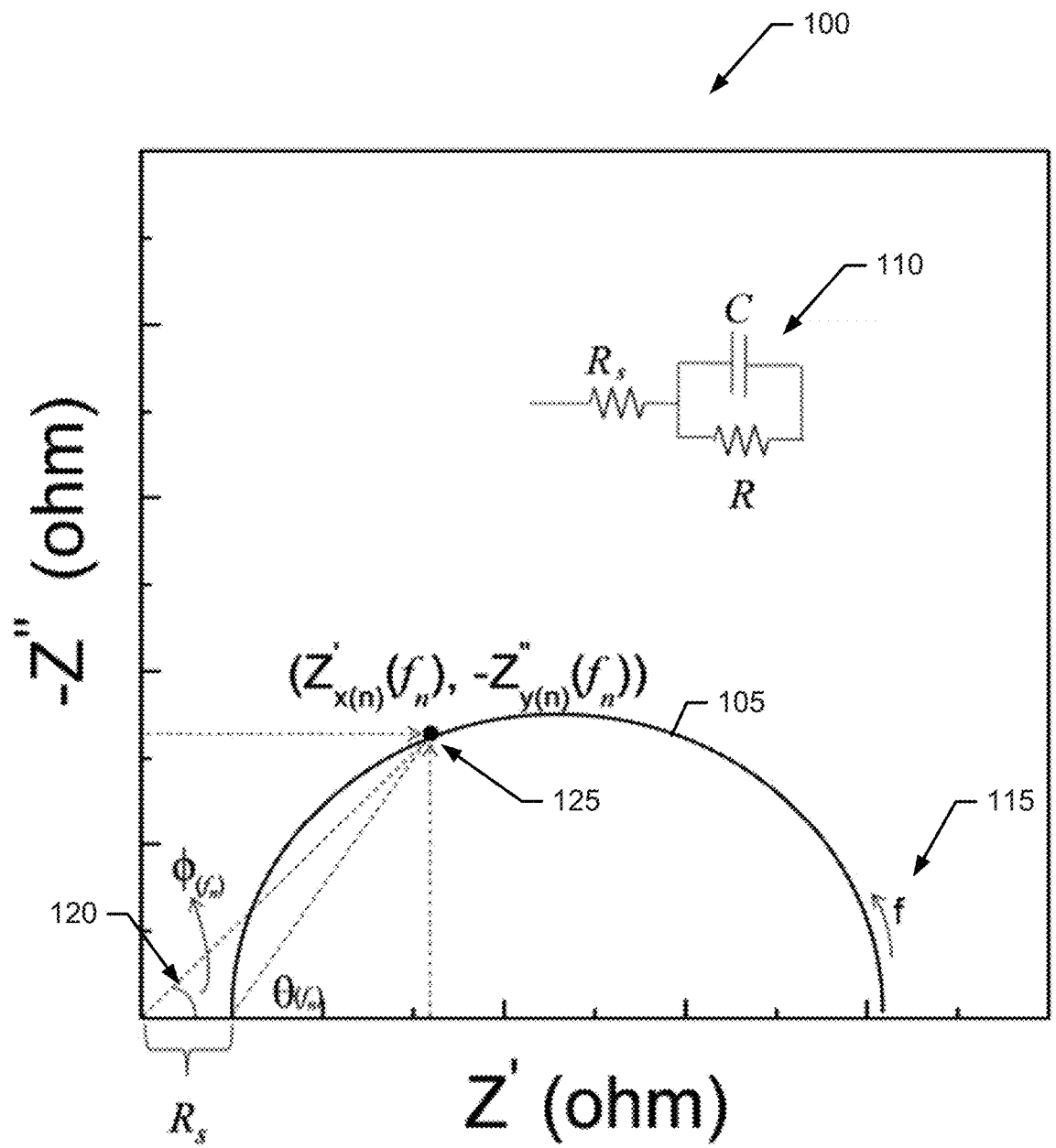
FIG. 1 illustrates a chart of electrical impedance of an equivalent capacitor-resistor network according to some example embodiments.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

According to various example embodiments, systems, apparatuses, and methods are described herein that can be used to perform battery management, and in particular, battery and system protection based on measurements of the impedance phase shift of a cell of a battery. As described herein, a cell of a battery (e.g., a lithium-ion (Li-ion) cell of a battery) may, for example, reach a thermal runaway condition in which thermal conditions within the cell have reached a point that the cell chemistry can ignite causing, for example, damage to the cell and surrounding cells of the battery. Prior to reaching thermal runaway, a cell may experience certain pre-thermal runaway conditions that can be correlated to characteristic changes in the impedance phase shift of the cell, which is also referred to as simply the phase shift of the cell.

According to some example embodiments, an apparatus and system are described that monitors and utilizes measurements of the impedance phase shift of a cell as determined between an applied current through the cell and the voltage measured across the cell to determine whether the cell is in a pre-thermal runaway condition and, in response to detecting such condition, take protective action to prevent or decrease damage that can result when thermal runaway occurs. In this regard, according to some example embodiments, the impedance phase shift of a cell may be measured and monitored, and compared to a protection profile to determine whether the impedance phase shift measurements are indicative of a cell that is in a pre-thermal runaway condition. Such a protection profile may be defined in a number of different ways in relation to characteristic changes in the impedance phase shift that can occur prior to a thermal runaway event. As such, according to some example embodiments, systems, apparatuses, and methods are provided herein that employ or are configured to employ prediction and prevention of thermal runaway in cells of batteries (e.g., Li-ion cells) based on monitoring of cell impedance, and more specifically, a component of impedance referred to as the impedance phase shift.

Thermal runaway of a cell of a battery can occur in a number of different scenarios, which can be classified as externally-caused or internally-caused thermal runaway. Externally-caused thermal runaway and associated fires can be the result of, for example, electrical abuse (e.g., overcharging, fast charging, over-discharging, external short-circuit, etc.), mechanical abuse (e.g., container breaching due to, for example, compression), and thermal abuse (e.g., exposure to external heat, or charging while the cell is thermally cold). Internally-caused thermal runaway and associated fires can be a result of, for example, internal short-circuit and degradation of the chemicals in the cell anode and cathode. Further, external abuse conditions can lead to similar effects, such as an internal short circuit within the cell.

According to some example embodiments, external conditions of a cell can be monitored in order to prevent thermal runaway and a fire, for example, using voltage sensors to identify emerging overcharge and over-discharge conditions. Further, temperature sensors may be mounted on the surface or in proximity of a cell to identify hot and cold environments and facilitate the provision of warnings or implementation of protection equipment, such as interrupt switches. However, internal failures of these types may be difficult to predict using, for example, voltmeters and surface-mounted thermal sensors. As such, while such approaches can prove useful as a supplemental consideration, the monitoring of cell voltage or surface temperature has not been proven to be sufficiently effective to proactively detect thermal runaway conditions in order to take protective action. Additionally, internal shorts and degradation of the chemicals in the electrodes of a cell can be difficult to monitor or predict because shorts and degradation do not initially alter the surface temperature of the cell or other externally measureable attributes. In this regard, the voltage of the cell may not reach set limits to initiate protection by, for example, a battery monitoring system, until after the cell is past the opportunity to avoid thermal runaway.

Further, the cell architecture of a battery (e.g., single-cell batteries and multi-cell batteries) can play a role in the potential for a broader failure of a battery. Single-cell batteries can be found in, for example, cell phones, while multiple-cell batteries may be present in, for example, laptops and electric vehicles. In electric vehicles, for example, the number of cells may be in the thousands. Tens of thousands of cells may be utilized in the context of the electric grids. With such large numbers of cells within relatively close proximity of each other, the likelihood of cascading cell failure due to a single cell failure is high.

Often, not every cell in a multi-cell battery will experience internal shorts or chemical degradation at the same time. Both can occur gradually due to calendar and cycle-life aging, or due to impurities in materials and manufacturing defects. With that said, if a fire is initiated even in a single Li-ion cell, consequences could be detrimental to the entire battery and the equipment that the battery is serving. Typically, the origin of fire in most Li-ion battery incidents can be traced to a single cell. Thermal runaway and a fire in a single cell may be initiated by a set of cascading chemical reactions between the reactive materials in the electrodes and the solvents in the electrolyte of the cell. The solvents and structural materials, such as separators, may contain hydrocarbons that can be flammable. Further, oxygen may not be required to support a fire in the cell because the cathode often contains oxidizing chemicals.

As material degradations or internal shorts progress within a cell leading to thermal runaway, the impedance of a cell's individual components, namely, the impedance of the anode, cathode, electrolyte, separator, and current collectors can be affected. In this regard, according to some example embodiments, impedance meters configured to measure, for example, the total impedance across the positive and negative terminals of a cell can be implemented, which can indicate the impedance of each individual component of the cell. Further, degrading cell components can also impact the cell impedance. For example, the impedance of a graphite anode may be dominated by the solid-electrolyte-interphase layer (SEI layer) of the anode. The SEI layer may also operate to prevent direct contact between the graphite anode and the electrolyte, thus preventing, for example, a cascading exothermic chemical reaction caused by the anode and the electrolyte and increasing the temperature of the anode. Long before the exothermic reactions start, the degradation process will begin to change the SEI layer impedance. Similarly, degradation in the cathode may initiate changes in its impedance before allowing the electrolyte to percolate and interact with the cathode chemicals.

Internal shorts within a cell can occur for a variety of reasons, including foreign-object-debris (FOD) inside the cell, excessive current flow through the cell, and cell heating by external sources. FOD can cause thermal runaway and associated fire when a low resistance electron-conducting path is created inside the cell between the anode and the cathode. Initially, FOD may be micron or sub-micron-size particles within the cell that grow with the charge-discharge cycles. In the initial stages of growth, FOD may not even be in contact with the anode or the cathode. FOD are, however, difficult to detect, especially if present only in the electrolyte. However, after FOD contact with the anode or the cathode, the impedance of that electrode will be changed.

Flow of excessive current through a cell, or cell heating, can also destroy the SEI layer, exposing, for example, the graphite to the electrolyte and initiating exothermic chemical reactions. Such reactions can, for example, generate gaseous products, thereby increasing a cell's internal pressure, changing the electrode shape and causing an internal short. As an internal short evolves, the impedance of the anode or the cathode can change, and those changes can be identified by, for example, using an online impedance meter according to some example embodiments. According to some example embodiments, impedance meters can be small, but yet sensitive enough to identify subtle changes in the anode and cathode impedances. Effective use of such impedance meters for reducing or eliminating thermal runaway and increasing electrical efficiency in Li-ion batteries may involve directly monitoring the impedance of a cell's components, including the anode and the cathode, which may be indicative of thermal issues in the cell. According to some example embodiments, monitoring the impedance of the electrolyte may be relevant to some cell analyses, but with respect to detecting thermal runaway, the value of the electrolyte impedance ($R_s$), e.g., the series total resistance of the electrolyte and the separator, may be less valuable. $R_s$ may, for example, be a predictor of a state of health (SoH) in the cell, but a change in the SoH does not necessarily indicate thermal runaway. A degrading cathode or a disintegrating SEI layer, for example, need not alter the resistance of the electrolyte. On the other hand, degradation of the SEI layer and the active materials in the anode and cathode can affect the respective impedance. As such, according to some example embodiments, an impedance meter, for example, tuned to monitor the impedance of the anode and the cathode can be an effective measurement tool for capturing impedance measurements that can be leveraged to considerably improve thermal safety in, for example, Li-ion cells. In particular, the value of the impedance phase shift of the cell, as further described herein, can be monitored to predict and possibly prevent thermal runaway events.

The electrical impedance—a complex quantity—can be represented by two real numbers, e.g., impedance amplitude |Z| and impedance phase shift (φ) both of which are directly measurable. According to some example embodiments, the impedance phase shift at a specified frequency can, depending on the implementation, have a higher measurement resolution and may be much less dependent on the size of a cell of a battery (i.e., the Ampere-hour (Ah) capacity). As mentioned above, characteristic changes in the impedance phase shift prior to and during a rapidly evolving thermal runaway event can be measured and monitored to identify such characteristic changes and take action to avoid damage to the battery that can result from a completed thermal runaway event. According to some example embodiments, a battery management system or battery cell evaluation system that is configured to perform impedance phase shift monitoring on, for example, a per second, per cell basis, may be capable of limiting or avoiding thermal runaway conditions.

As such, according to some example embodiments, example methods, and associated systems and apparatuses configured to perform the example methods, are provided for prediction and prevention of thermal runaway in, for example, Li-ion batteries. Such example methods may be based on, for example, rapid (e.g., on the order of seconds) monitoring of the cell impedance. As mentioned above, cell impedance Z—a complex quantity—may be represented by two real numbers, e.g., impedance amplitude |Z| and impedance phase shift $\varphi$ at a specified frequency. To provide insight into the values of the impedance amplitude and phase shift, FIG. 1 provides a chart 100 of a Nyquist representation of the electrical impedance as the negative of the imaginary component of impedance (−Z") with respect to the real component of impedance (Z') for an equivalent capacitor-resistor network 110, which can be used to demonstrate and visualize the relationship between the measurable values of impedance amplitude and impedance phase shift, as well as the computed values of real component Z', imaginary component −Z", and θ. The value of θ is the phase shift corrected for the series resistance $R_s$, which may be a representation of the anode impedance and thus the anode temperature. Unlike the impedance phase shift $\varphi$, the phase shift θ corrected for the series resistance cannot be measured directly, but is a computed value based on the impedance phase shift $\varphi$ and the impedance magnitude |Z|. According to some example embodiments, the impedance phase shift may be used as a proxy for the phase shift corrected for the series resistance.

In this regard, FIG. 1 includes an impedance graph of the imaginary component −Z" with respect to the real component Z' for all frequencies or, for example, a range of frequencies from 1 Hz to 1 kHz. Because impedance is a frequency-dependent complex number, both impedance amplitude and impedance phase shift change with frequency f. The arrow 115 indicates the direction of increasing f (counterclockwise), and at any frequency, $f_n$, the real component ($Z'_{x(n)}$), and imaginary component ($-Z''_{y(n)}$) can be directly computed from the impedance amplitude $|Z|_n$ and the impedance phase shift $\varphi_n$ measured at $f_n$ (where n is an integer number, and x(n) and y(n) are coordinates based on the number n). In this regard, Z' and −Z" can be expressed in terms of impedance amplitude |Z| and impedance phase shift $\varphi$ (and vice versa), as follows:

$$Z' = |Z|\cos(\varphi)$$

$$-Z'' = |Z|\sin(\varphi)$$

with $|Z| = [(Z')^2 + ("Z")^2]^{1/2}$.

As such, based on the measured impedance values of impedance amplitude |Z| and phase shift $\varphi$, the other common impedance values can be determined.

Virtually every electrode inside a cell can be represented as an electrical equivalent circuit containing a resistor (R) connected in parallel to a capacitor (C) similar to the equivalent capacitor-resistor network 110 of FIG. 1. The electrolyte of a cell can have properties electrically similar to a resistor and electrodes, and current collectors can exhibit inductive behavior (L). A cell can therefore be modeled like a network connecting a series-parallel combination of resistors and reactive elements. Accordingly, the impedance amplitude can have a large dependence on the cell size, while the impedance phase shift can be much less dependent on cell size. For example, a cell with a large cross-section (e.g., large area anode and cathode) can exhibit a smaller impedance amplitude than a cell with a smaller cross-section under the same conditions. However, the respective impedance phase shift values can remain almost constant, and therefore can be considered independent of cell size. As such, impedance phase shift may be more readily relied upon, for example, as a proxy for the internal cell temperature and to predict thermal runaway. Additionally, the impedance phase shift, according to some example embodiments, can have a higher measurement resolution relative to, for example, the impedance amplitude.

More specifically, phase shift, as described herein, can be the measure of the phase lead time for an applied AC (alternating current) voltage over the AC current observed when the "reactive element" in the circuit is a capacitor. A negative phase shift occurs when voltage lags current (capacitive circuit) and a positive phase shift occurs when voltage current (inductive circuit). In this regard, when the complex impedance is represented in polar form, as provided in FIG. 1, this lead time between the phases can be represented by a negative phase angle 120 due to the capacitance. Further, the electrical-equivalent behavior of a cell includes the attribute that the cell's impedance can be dependent on the frequency of the applied AC signal. As such, the measured impedance can be represented in a complex-plane, Nyquist plot (as seen in FIG. 1), in which the impedance of a cell at multiple frequencies can be first resolved into its respective real and imaginary components.

In the example shown in FIG. 1, the dot 125 represents the real (Z') and imaginary (−Z") components at one of the measured frequencies, f. The semicircular shape 105 of the Nyquist plot of the impedance can be a result of the response of the respective equivalent circuit at various measured frequencies. As such, according to some example embodiments, an impedance meter may construct impedance plots similar to the one shown by measuring the amplitude of the impedance |Z| and the impedance phase shift $\varphi$ at multiple frequencies $f_n$. Such an impedance meter need not measure the series resistance $R_s$ or the angle $\theta$ directly. Since the amplitude |Z| and phase shift $\varphi$ may be measured, these measured values may be used to calculate the real component Z' and the imaginary component −Z". As such, the error in the calculated real component Z' and the imaginary component −Z" may be higher than the error in the measured amplitude |Z| and phase shift $\varphi$ because these terms are calculated rather than directly measured.

Further, according to some example embodiments, an example method for measuring these impedance values can have implications in estimating the temperature internal to the cell ($T_{int}$). If random errors are present in both parameters, i.e., in the real component Z' and imaginary component −Z" as in Nyquist plots, then conventional data smoothing and other mathematical fittings may not be applicable to these values. Therefore, in many instances, estimations of electrolyte resistance $R_s$, the real component Z' of impedance and the imaginary component −Z" of impedance can be prone to error and therefore less reliable then the directly measured values.

As mentioned above, the impedance phase shift can be less sensitive to the Ah-capacity of a cell relative to the impedance amplitude, and the impedance phase shift can also vary as a function of the internal temperature of the cell. Further, measuring impedance phase shift can be performed, according to some example embodiments, using instruments that can determine the impedance phase shift with a resolution of, for example, $10^{-3}$ degrees, using implementations that are relatively affordable, small, and low power. However, the impedance amplitude may be measured, using similar affordable, small, and low power instruments, on the order of tens of milliohms for a 5.3 Ah cell, but only about 1 mΩ for a 50 Ah cell. As such, for a 50 Ah cell, the net change in the impedance amplitude over a 50° C. change in temperature is less than a milliohm. By contrast, the net change in the impedance phase shift over the same 50° C. temperature is about 20° for both small and large cells. Additionally, from a signal-to-noise (S/N) perspective, direct impedance phase shift measurements have temperature dependency and a rate of change that is advantageous relative to measurements of the impedance amplitude.

According to some example embodiments, the use of the impedance phase shift as a parameter for consideration in battery protection by a cell evaluation or battery management system has a number of advantages. In this regard, impedance phase shift measurements have a relatively high S/N ratio as well as high cell temperature dependence, as indicated above. As such, the impedance phase shift may be measured and analyzed to gain valuable insights into the operation of a cell, and in particular, insights into the internal temperature ($T_{int}$) regardless of whether the cell is under static conditions or dynamic conditions, such as during charging and discharging. Further, the impedance phase shift can be monitored on a single-cell battery or on a per cell basis within a multi-cell battery by leveraging the architecture of a cell evaluation or battery management system that can individually interrogate each cell within a battery.

Figure 2:
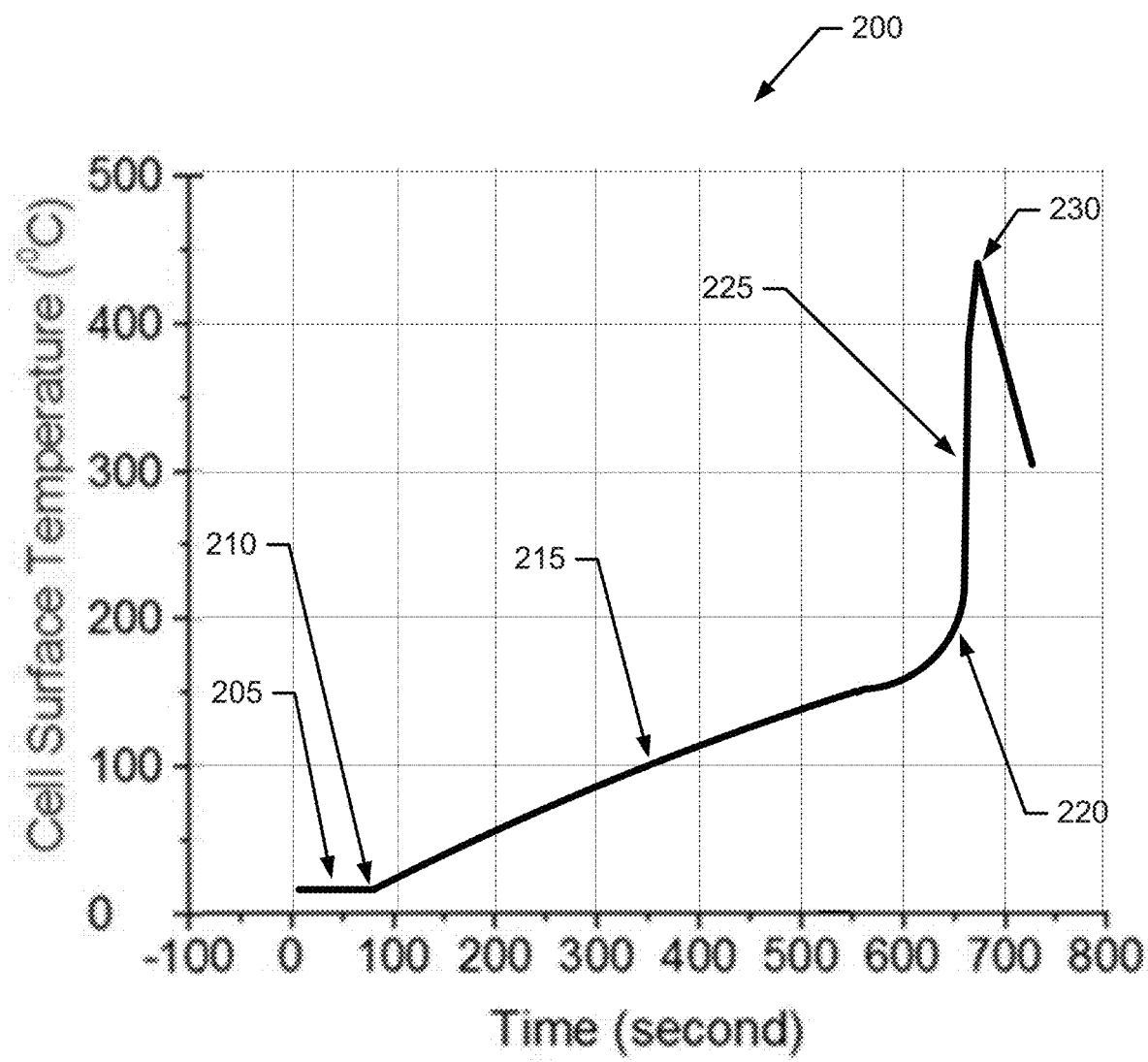
FIG. 2 illustrates a chart of the surface temperature of a cell that is subjected to thermal runaway according to some example embodiments.
Figure 3:
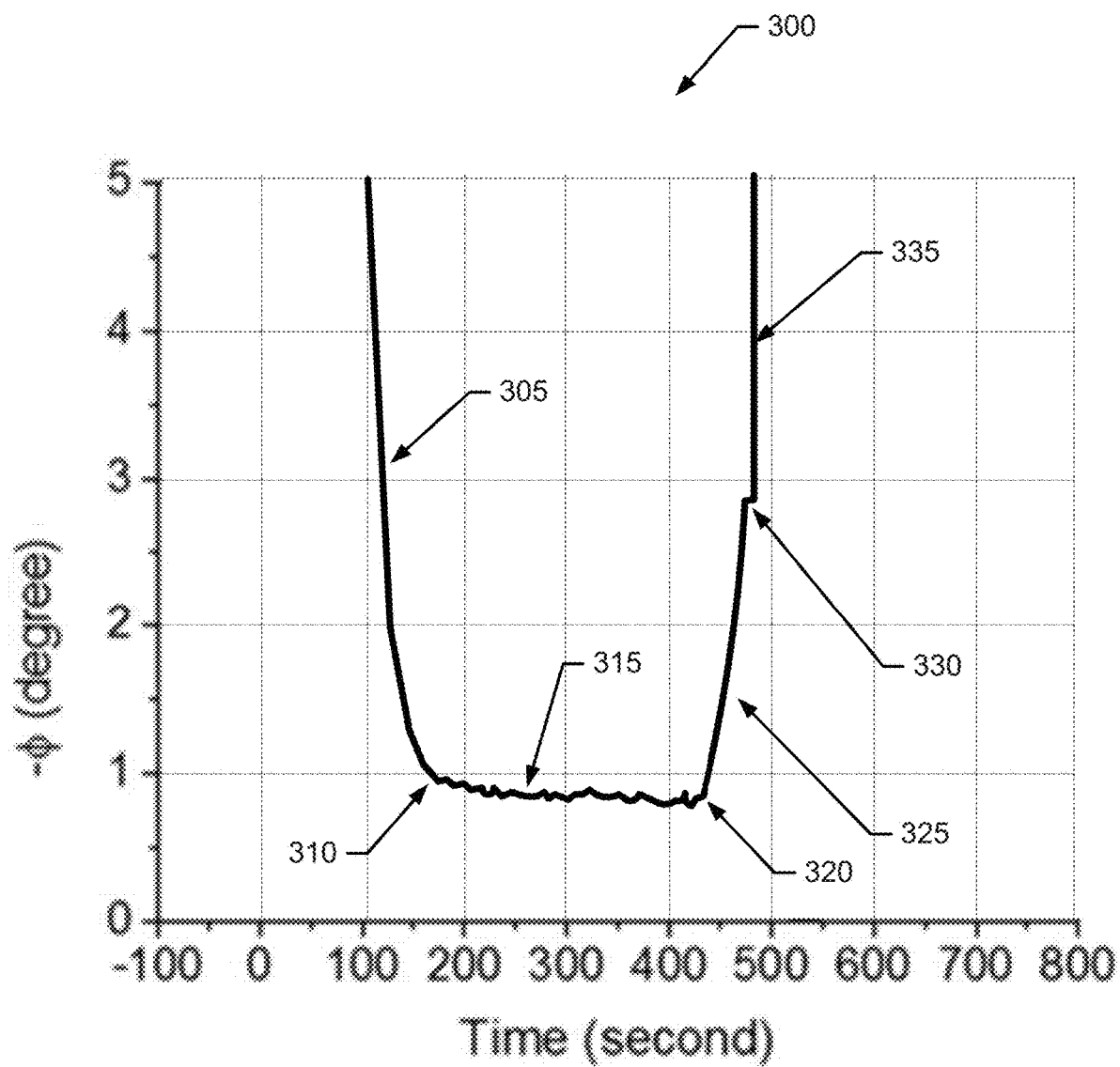
FIG. 3 illustrates a chart of the impedance phase shift of a cell experiencing heating as provided in FIG. 2 according to some example embodiments.

Having established that measurement and monitoring of the impedance phase shift can be useful for battery protection, the discussion of FIGS. 2 and 3 describe in more detail a characteristic response in impedance phase shift as a cell progresses through a thermal runaway event. As further described below, based on the characteristics that are present in the impedance phase shift over time, a protection scheme in the form of a protection profile can be developed and implemented, according to some example embodiments, that identifies changes in the impedance phase shift that are indicative of pre-thermal runaway conditions and interrupts the thermal runaway process to protect the cell(s) and the battery.

In this regard, FIG. 2 shows an example temperature graph 200 of the temperature of a cell's surface ($T_{surf}$) with respect to time as the cell progresses through a thermal runaway event. In the example temperature graph 200, the cell has been subjected to rapid heating to induce the thermal runaway event. In this regard, at 205, the temperature of the cell is at approximately ambient temperature (approximately 20° C.) and no heating is being applied to the cell. At 210 (approximately 75 seconds), heating is initiated and a rapid increase in heat is being applied to the cell. The temperature of the cell therefore increases at 215 due to the external heating and the continued operation of the cell at the higher temperatures. As can be seen, the temperature of the cell increases from approximately 25° C. to about 200° C., at which time thermal runaway begins at 220. Thus, at about 650 seconds, thermal runaway begins and the temperature rapidly rises at 225 from about 200° C. to about 450° C. in only a few seconds, at which point the runaway ends due to, for example, combustion and complete failure of the cell, upon which the temperature drops after reaching a peak at 230.

Having described an example thermal runaway process from a temperature perspective in FIG. 2, FIG. 3 provides a graph 300 of the impedance phase shift as a cell progresses through the same thermal runaway event described with respect to FIG. 2. It is noteworthy that the impedance phase shift is graphed as a negative value (−φ) and the following discussion will treat, for example, a falling impedance phase shift as a drop in the impedance phase shift, when in fact the drop on the impedance phase shift is truly an increase in the value. In this regard, it can be seen that when the temperature begins to rise at about 100 seconds, the impedance phase shift drops at a high rate at 305 to below 1° at 310. More specifically, the impedance phase shift drops from about 5° to about 1° in about 50 seconds with a slope of about −1°/12.5 seconds. This sudden drop or change in slope of the impedance phase shift is an example of a phase shift characteristic that be leveraged for thermal runaway prediction and used for cell and battery protection.

From about 150 seconds to about 450 seconds (as the temperature is increasing from about 60° C. to about 125° C. as shown in FIG. 2), the impedance phase shift plateaus at 315 to a value that is slightly less than the 1° and is sustained within a relatively tight range for approximately 300 seconds. Again, this maintained value of the impedance phase shift below 1° is characteristic of the impedance phase shift as a cell progresses through a thermal runaway event, and therefore this characteristic may additionally or alternatively be leveraged for thermal runaway prediction and used for cell and battery protection purposes.

Additionally, at 320, the impedance phase shift increases at a high rate from below 1° during a pre-venting portion of the graph at 325 to where venting initiates at 330. Subsequent to initial venting at 330, the cell may continue to vent and the impedance phase shift may increase at an even more rapid pace at 335 as pre-thermal runaway venting occurs. As such, a characteristic increasing slope can be defined for region 325 that is approximately a 2° increase in about 25 seconds or a slope of about 1°/12.5 second slope. Further, this may constitute yet another characteristic increasing slope that may be defined for region 335 that is approximately 2.5° in 10 seconds or a slope of about 1°/4 seconds.

Figure 4:
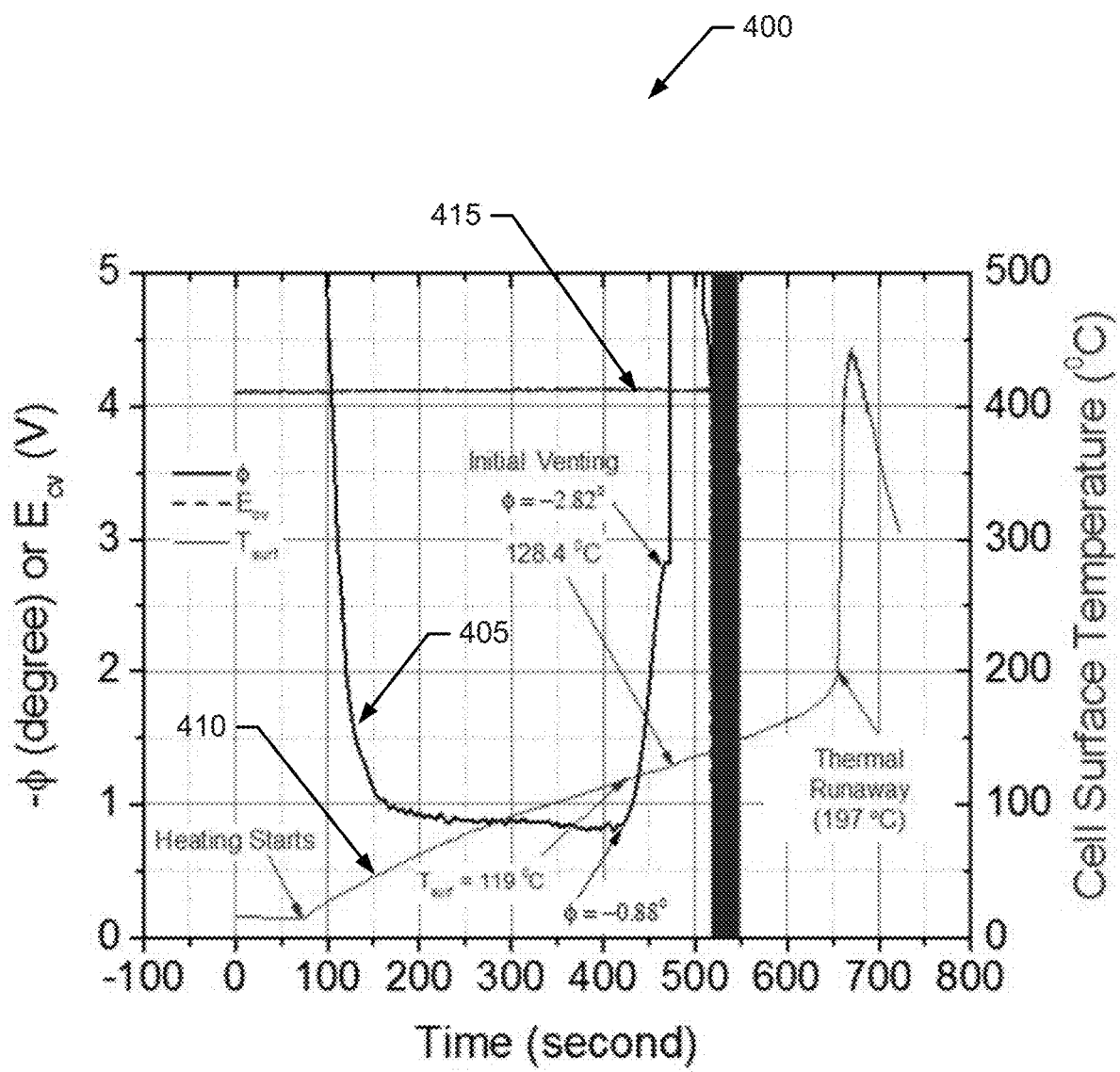
FIGS. 4 and 5 illustrate charts for thermal runway scenarios due to external cell heating according to some example embodiments.
Figure 5:
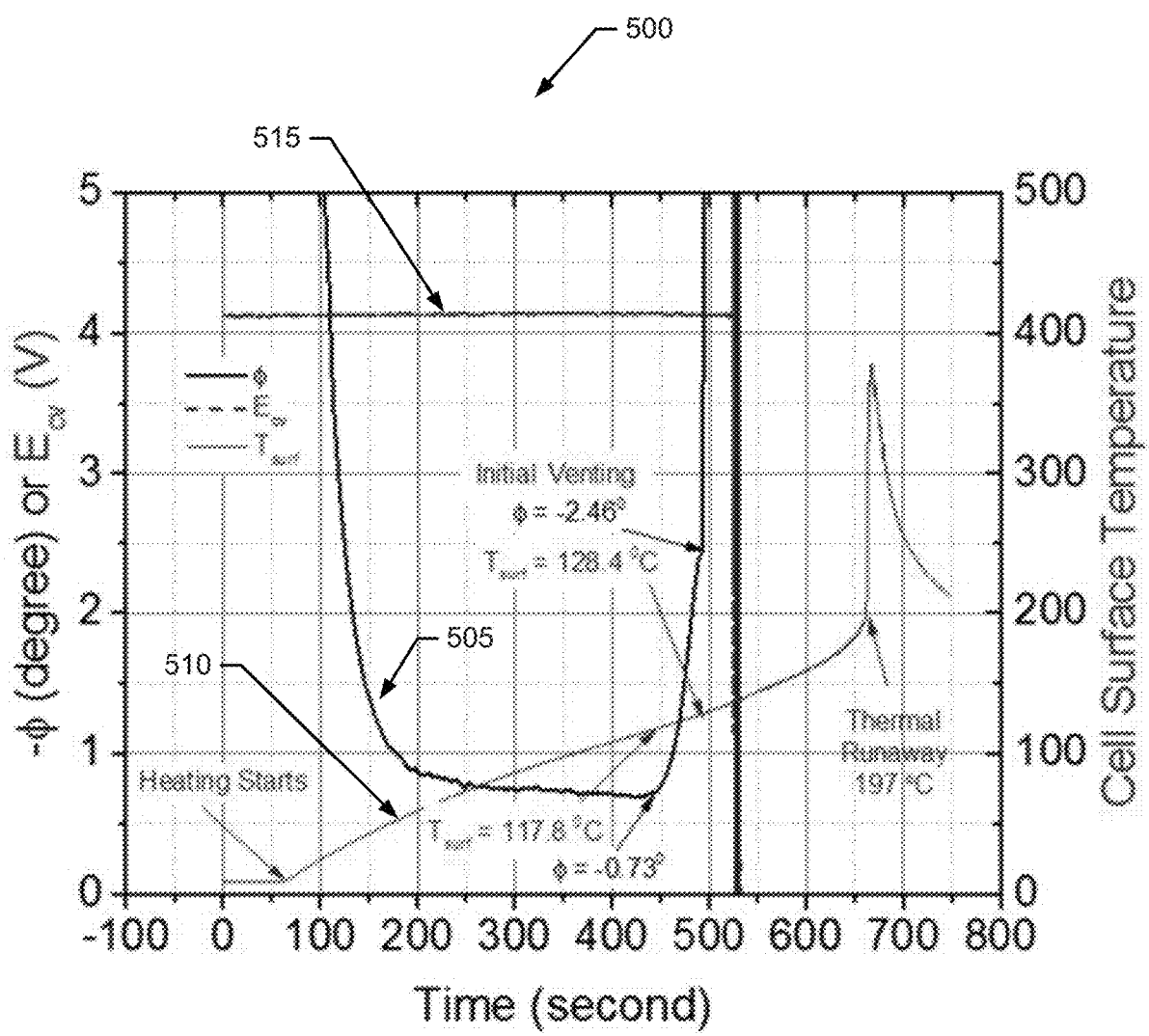

The characteristics of the impedance phase shift described above leading into a thermal runaway event occur in a similar manner independent of the circumstances in which the thermal runaway event is initiated by external heating. FIGS. 4 and 5 provide further experimental results indicating that the impedance phase shift provides these characteristics. The data provided in FIGS. 4 and 5 illustrate an example application of impedance phase shift monitoring that could be used for preventing battery venting and thermal runaway caused by heat. In those examples, before heating started, the surface temperature of the cell $T_{surf}$ was slowly decreasing due to decreasing external temperature. The changes in impedance phase shift φ as the surface temperature $T_{surf}$ increases with heating are consistent with other observations and testing, where the impedance phase shift φ initially changed from a relatively large value to a smaller value with increases in temperature. The rate of change of the impedance phase shift φ has been determined to be nearly independent of the placement of heaters on the external surfaces of the cell, and, as such, the data in FIG. 4 was collected in response to application of a wrapped-around heater to a cell, while the data of FIG. 5 was collected based on two-heater patches affixed at different positions on a cell.

For the test results shown in FIG. 4 as illustrated in chart 400, moments before the heating started, the surface temperature $T_{surf}$ (shown by graph 410) was at 14.3° C., and impedance phase shift φ was at −9.5 degrees (not shown). 90 seconds after the heating started, surface temperature $T_{surf}$ increased to 51° C., and impedance phase shift φ (shown by graph 405) was −0.96 degrees, further decreasing to −0.79 degrees after 240 seconds of heating, when the surface temperature $T_{surf}$ reached 117° C. At this time point, the cell showed no indication of venting. After an additional 55 seconds, the cell vented, when the surface temperature $T_{surf}$ reached 128° C. However, the impedance phase shift φ showed significant change, from −0.8 to −2.9 degrees, indicating that the cell's interior was cooling, even though the cell's outer surface temperature $T_{surf}$ was increasing. As the cell started to vent, the surface temperature $T_{surf}$ continued to increase above 128° C., while the impedance phase shift φ and impedance amplitude |Z| (not shown) increased substantially, indicating cooling of the cell's interior due to gas release associated with venting. If the cell's interior was cooling before and during venting, the surface temperature $T_{surf}$ data does not provide an indication of that event, likely due to the continued external heating of the cell by the heater in the test. The vent gases may be generated during chemical reactions between, for example, the graphite anode and the electrolyte after the temperature has increased above 80° C., or a solvent vaporizes after the temperature has increased above its boiling point. Li-ion cells may contain organic solvents that are in liquid state at ambient temperatures, but some of them boil at around 90° C. Boiling of a liquid is an endothermic process that tends to absorb heat from its surrounding, and therefore could cause the temperature to fall and the impedance to raise. Furthermore, generation of gas could disrupt the internal structure of a cell, delaminate the anode and the cathode from the separator, causing the cell's internal impedance to increase. In addition, the vent valves of the cell may operate as the pressure inside the cell increases due to gas generation. Venting may cause a drop in pressure and cools the interior. Therefore, the observed large changes in impedance phase shift φ and impedance amplitude |Z| may be expected. The impedance phase shift φ during heating of the cell towards thermal runaway starts increasing substantially around 118° C., about 10° C. before the first venting occurred. The net change in the impedance phase shift φ is about 2 degrees, starting approximately 60 seconds before initial venting. On the other hand, cell voltage $E_{cv}$ (shown by graph 415) exhibited perceptible and abnormal changes only 60 seconds after initial venting.

As mentioned above, the observed change in impedance phase shift φ, from 0.8 degrees to 2.9 degrees, 60 seconds before venting, indicates a pre-vent increase in the cell's internal impedance, resulting from cooling of the interior of the cell, disruption of the cell's internal structure or a combination of both. Before venting, gases are generated inside the cell due to initially endothermic chemical reactions between, for example, the graphite anode and the electrolyte involving significant activation energy, requiring heat and thus cooling the cell's interior. Over that time interval, while the impedance phase shift φ increased from 0.8 degrees to 2.9 degrees (a factor of 3.6×), the impedance amplitude |Z| increased from 0.018Ω to 0.082Ω (a factor of 4.5×). Less significant changes occurred in the cell voltage ($E_{cv}$), which remained constant long after the cell vented, until the cell voltage started to fluctuate erratically, presumably due to development of internal shorts.

With reference to FIG. 5, chart 500 shows a similar characteristic impedance phase shift graph 505 despite the test being performed using a different application of a heat source as described above. A graph 510 of the surface temperature $T_{surf}$ of the cell and a graph 515 of the cell voltage $E_{cv}$ are also provided. As can be seen from the impedance phase shift graph 505, the phase shift again experiences a rapid drop during initial heating, followed by a leveling portion below 1° of impedance phase shift, and then followed by a rapid increase in impedance phase shift immediately prior to and during venting.

As such, the tests of FIGS. 4 and 5 confirm that the characteristic response of the impedance phase shift described with respect to FIG. 3 is consistent and therefore, a potential thermal runaway condition may be predicted, prior to venting, based on the impedance phase shift, while the cell voltage $E_{cv}$ and the surface temperature of the cell $T_{surf}$ are not as useful for predicting thermal runaway. The impedance amplitude |Z| can also provide an ability to predict thermal runaway conditions prior to venting. However, in some instances, the change in the value of the impedance amplitude |Z| is relatively small, less than 20-mΩ for a 3-Ah cell tested and 1-mΩ for the higher capacity 50-Ah cell. As such, reliance on the impedance amplitude requires additional precision of measurement. Thus, the impedance phase shift φ is shown to be a useful parameter for accurately monitoring a cell's internal temperature possibly after calibration and to predict venting and thermal runaway.

Figure 6:
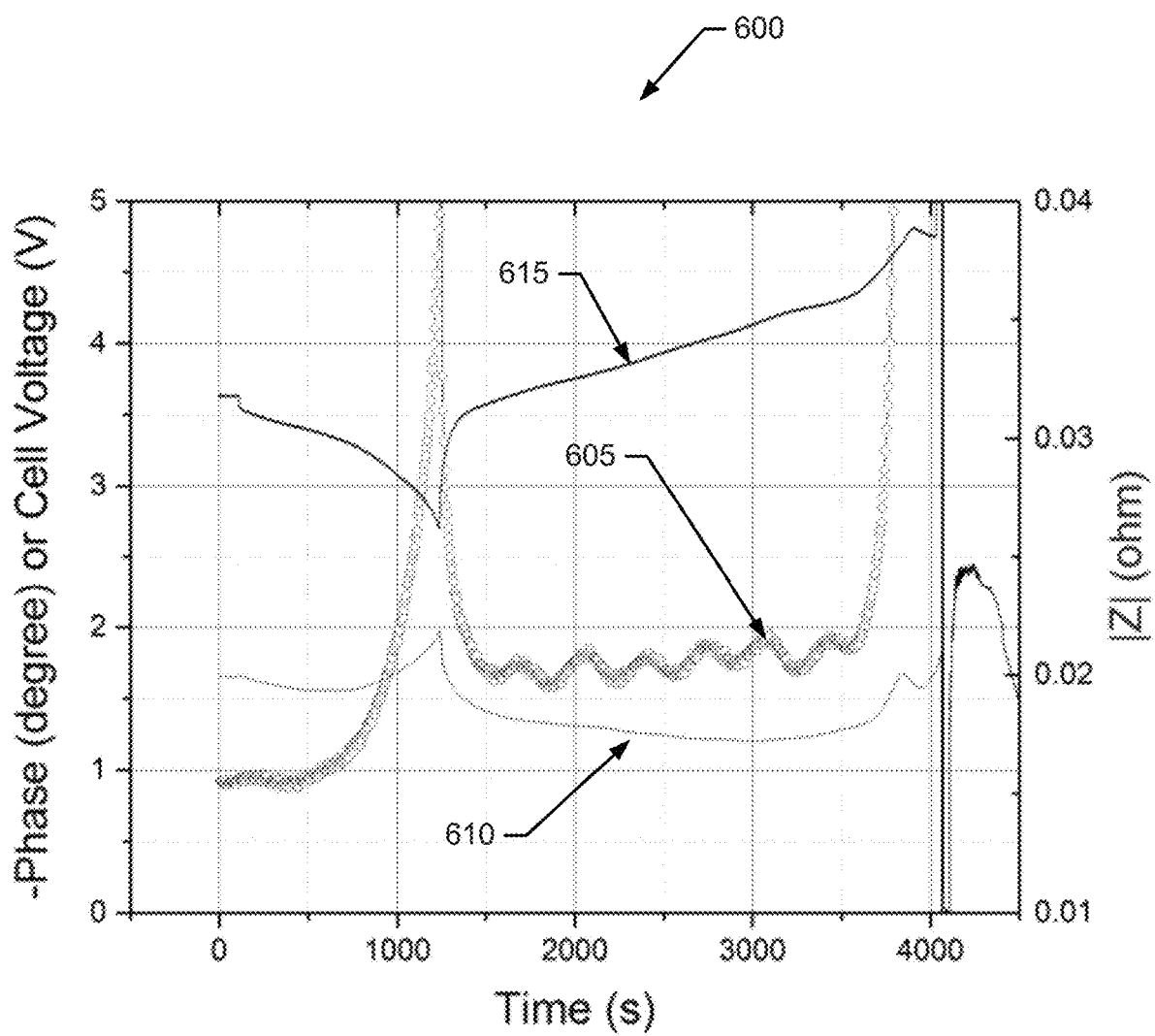
FIG. 6 illustrates a chart for a thermal runway scenario due to cell overcharging according to some example embodiments.

A further test to monitor the impedance phase shift response to a thermal runaway event was performed in a cell overcharging scenario. Again, in this context, the impedance phase shift value is shown to be valuable in predicting a thermal runaway event prior to venting. In this regard, FIG. 6 illustrates a chart 600 showing a graph 605 for impedance phase shift, a graph 610 for impedance amplitude, and a graph 615 for cell voltage. It can be seen that the impedance phase shift is maintained below 2° until a rapid increase at about 3700 seconds, which is about 500 seconds prior to the occurrence of venting. This increase can likely be associated with irreversible changes within the cell, while over this period, from about 3500 to about 3700 seconds, graph 615 shows that the increase in cell voltage is relatively small being at about 4.53 V. It can also be seen that the graph 610 of impedance amplitude |Z| tracks with the graph 605 of the phase shift graph, although in a less volatile manner within a narrower band.

As such, the characteristics of the impedance phase shift again have sustained values and rapid increases and decreases can be leveraged to predict venting and thermal runaway in advance. As such, again high magnitude slopes and sustained low values can be used within a protection scheme to take action prior to venting and thermal runaway due to the presence of these characteristics in the impedance phase shift response.

Figure 7:
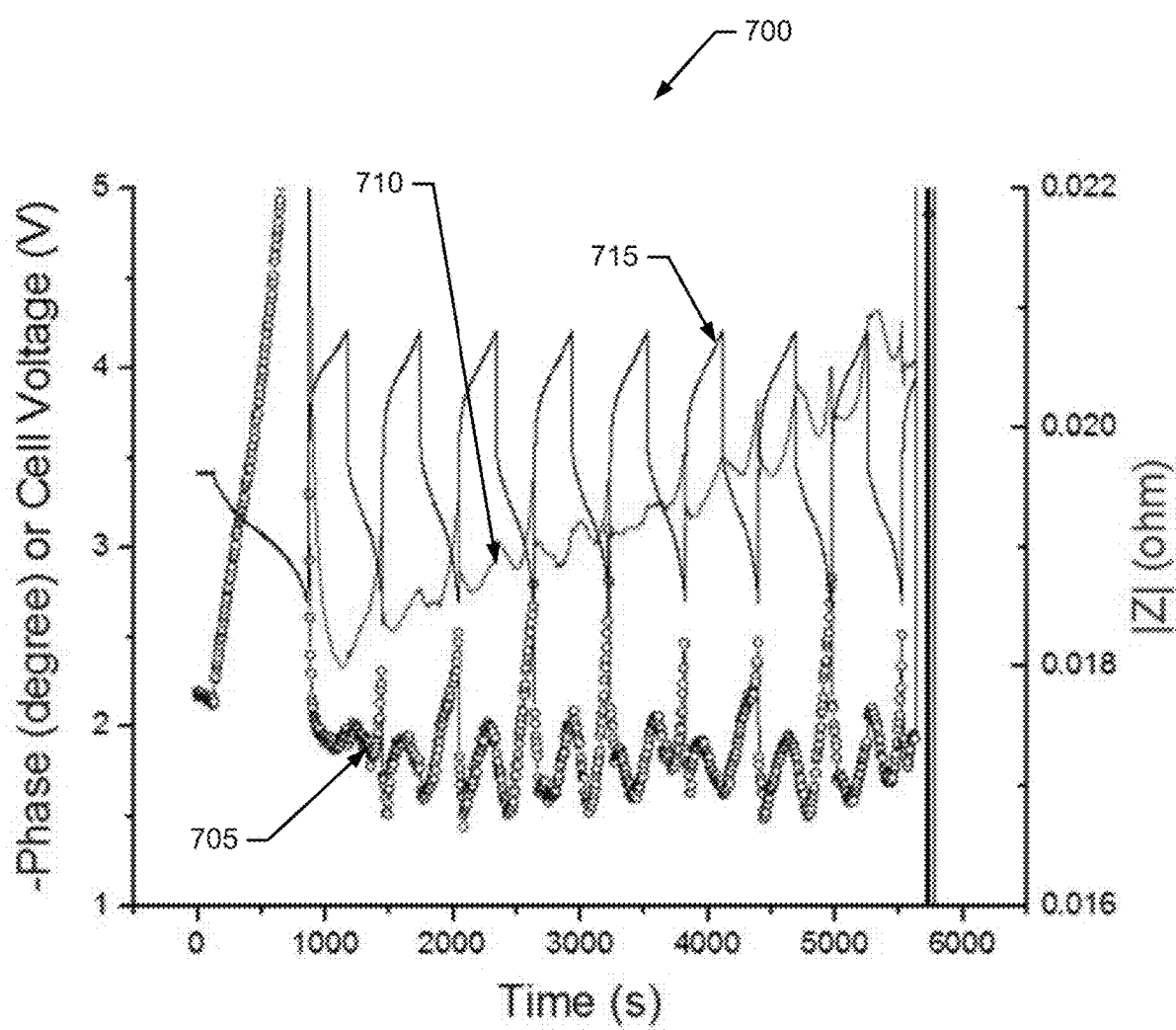
FIGS. 7 and 8 illustrate charts for a thermal runway scenario due to cycling of cell charging and discharging according to some example embodiments.
Figure 8:
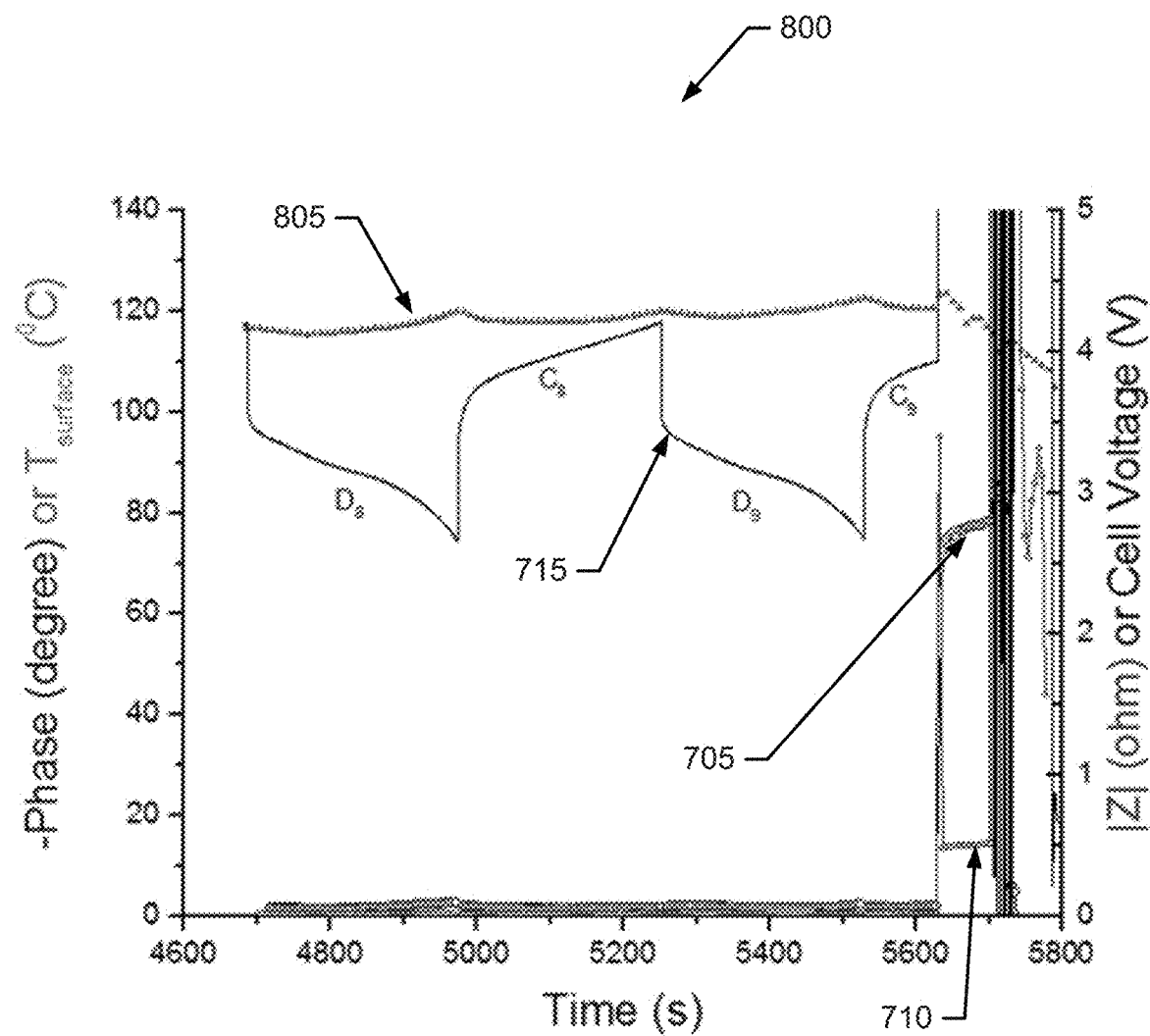

Now referring to FIGS. 7 and 8, a thermal runaway scenario based on fast charging and discharging of a cell is shown. In this regard, the chart 700 of FIG. 7 shows a graph 705 of the impedance phase shift, a graph 710 of the impedance amplitude, and a graph of the cell voltage 715. The chart 800 of FIG. 8 is an expanded view of the chart 700 with the addition of a graph 805 of the surface temperature of the cell $T_{surf}$.

The graph 705 of the impedance phase shift φ and the graph 710 of the impedance amplitude |Z| begin to increase substantially at relatively high rate in the ninth charging cycle when the venting occurred. As better viewed in the expanded chart 800, when the venting occurred at about 5700 seconds, a net change in impedance phase shift φ was in excess of 70°, and the impedance amplitude |Z| changed from 0.018 ohm to about 3 ohm prior to falling back to about 0.5 ohm. As such, the impedance phase shift prior to venting includes a rapid increase in a short time (high slope). Further, the value of impedance phase shift exceeds standard operation ranges by increasing beyond, for example, 10° and maintains a value in excess of 70° for hundreds of seconds.

In view of the various scenarios that can lead to thermal runaway that are described above, some characteristic behaviors of the impedance phase shift can be identified and leveraged for the purpose of identifying thermal runaway conditions, before venting and thermal runaway occurs, to take action to avoid or minimize damage to the cells, the battery, and associated equipment. In this regard, a protection profile may be constructed that defines criteria, parameters, or conditions with respect to the impedance phase shift that would trigger protective action or a protective device to, for example, trip a cell or battery offline (i.e., disconnect the cell or battery from the load), activate a cooling process for the cell or battery, or the like. In this regard, the protection profile may include any number of impedance phase shift-based criteria that are indicative of pre-thermal runaway conditions, that if satisfied, causes a protective action to be taken.

In this regard, for example, impedance phase shift-based criteria for the protection profile may be defined with respect the rate of change of the impedance phase shift, which may also be referred to as the slope of the impedance phase shift, as a function of degrees of change with respect to time. With reference again to, for example, the scenario of FIG. 3, high magnitudes slopes occur at 305, 325, and 335. As stated earlier, the magnitude of the slope at 305 is about 1°/12.5 seconds, the magnitude of the slope at 325 is also about 1°/12.5 seconds, and the magnitude of the slope at 335 is about 1°/4 seconds. Since these high amplitude slopes for the impedance phase shift do not generally occur during normal operation of a cell, a slope-based criterion based on these values for a protection profile may be defined. In this regard, a determination may be made that protective action should be taken before these high magnitude slopes are measured, if possible. As such, for example, a threshold impedance phase shift slope criteria for a protection profile may be defined as less than one degree of impedance phase shift per twenty-five seconds (1°/25 seconds). As such, if impedance phase shift measurements are taken for a cell indicating that the rate of change of the impedance phase shift (or the slope) is 1° per 25 seconds or less, then protective action may be taken because a pre-thermal runaway condition exists.

Similarly, impedance phase shift-based criteria may be defined with respect to a threshold impedance phase shift value or a threshold magnitude of an impedance phase shift value for a set duration of time. Again, referring to FIG. 3, at 315 the impedance phase shift is below 1°, indicating the cell is relatively hot, and continues to fall below 1° for extended period, in the example shown in excess of 200 seconds, indicating continuous heating and a sustained increase in internal temperature. This is another impedance phase shift characteristic that is indicative of pre-thermal runaway conditions that generally do not occur during normal operation of a cell. As such, a protection profile criterion can be defined with respect to a threshold impedance phase shift magnitude value of less than 1° of impedance phase shift for a time period of at least 25 seconds. Accordingly, if measurements of the impedance phase shift have a magnitude of less than 1° for a period at least 25 seconds, then protective action may be taken because a pre-thermal runaway condition exists. Similarly, with regard, to the scenario of FIG. 8, the phase shift, as the cell reaches thermal runaway, rises rapidly and then levels between −70° and −80°. However, sustained phase shift values with a magnitude more than 20° are not typical in a properly operating cell. As such, based on this scenario of FIG. 8, a protection profile may be defined with a magnitude of greater than 20°, possibly for at least 25 seconds.

Further, other types of criteria may be combined into the protection profile to trigger protective action. In this regard, for example, a slope or threshold value may be applicable for determining whether protective action should be taken only when a cell is currently being charged. In this way, criteria may be set within the protection profile to more closely align the criteria with attributes of a particular scenario. Additionally, more than one criterion may be included in a protection profile (e.g., a slope greater than A or a value below B for at least C seconds). Further, more than one criterion may be included in the protection profile that is time sequenced (e.g., first a slope greater than A followed by a value below B for C seconds).

Figure 9:
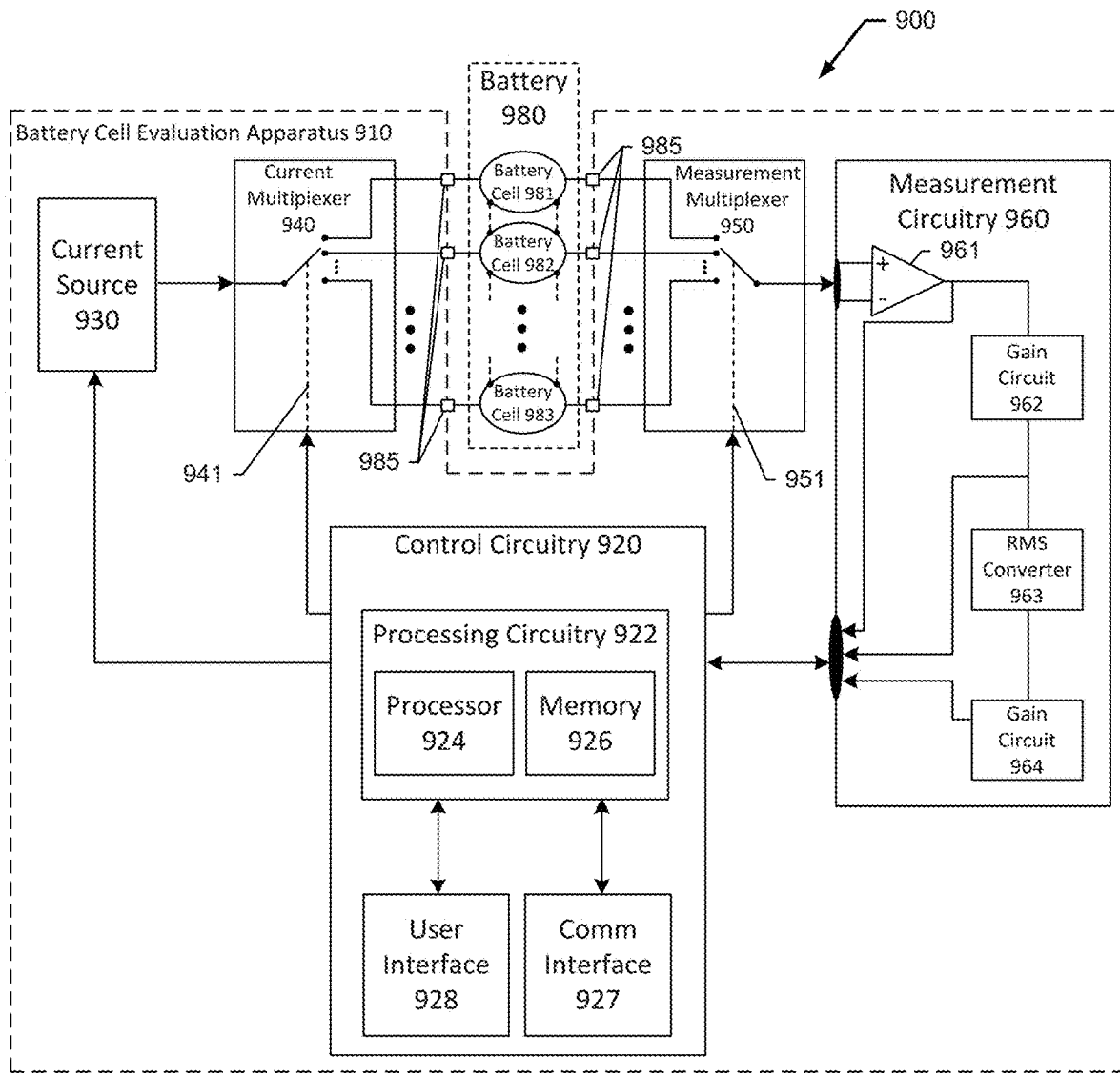
FIG. 9 illustrates a system comprising a battery cell evaluation apparatus and a battery according to some example embodiments.
Figure 10:
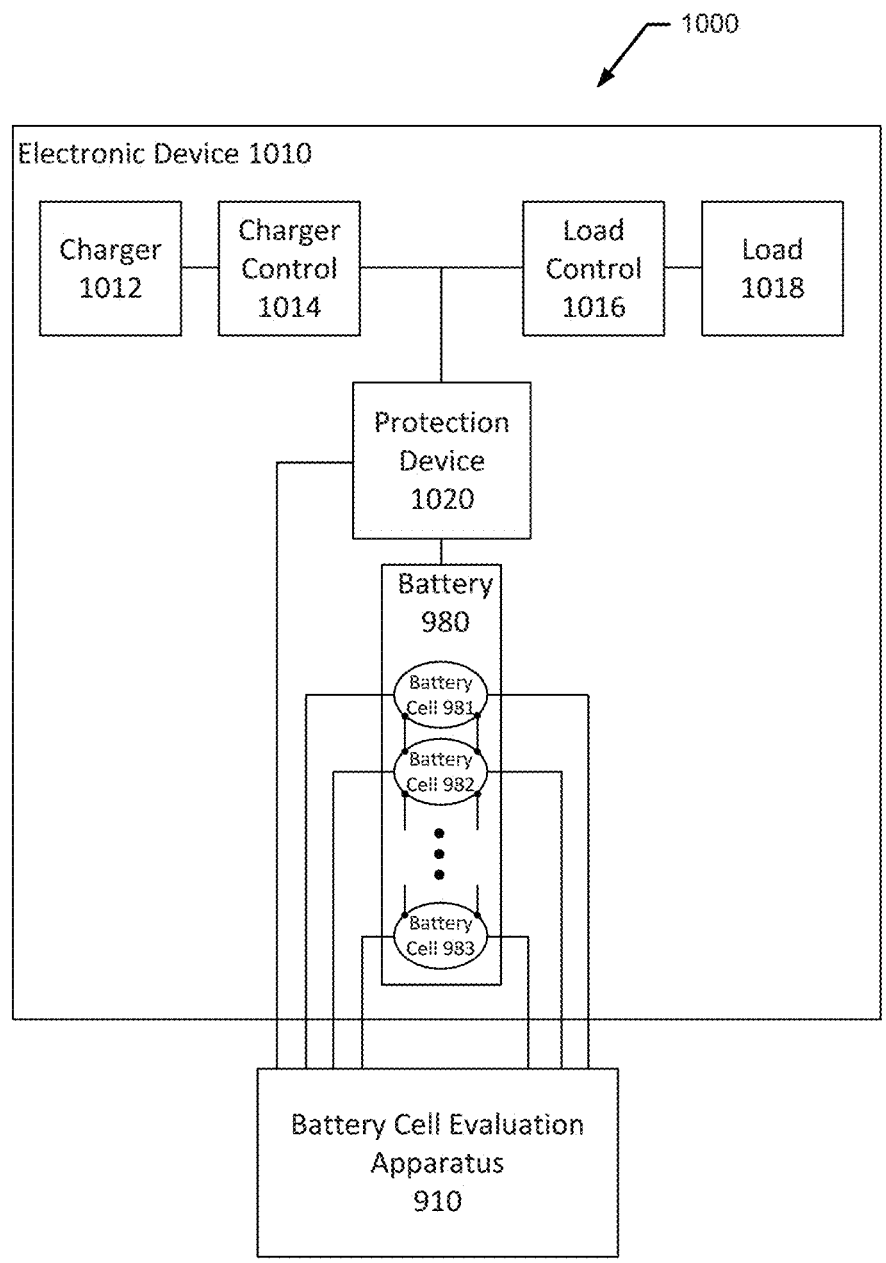
FIG. 10 illustrates a system comprising a battery cell evaluation apparatus and a battery powering an electronic device according to some example embodiments.

Having established that the measurement and monitoring of impedance phase shift can be useful in prediction of thermal runaway conditions, the following discussion of FIGS. 9 and 10 provides a description of systems, apparatuses, and methods that can benefit from the use of the measuring and monitoring phase shift in the context of battery management systems. In addition to being useful in the context of battery protection and the avoidance of thermal runaway, the measuring and monitoring of phase shift can also provide insights into the internal temperature $T_{int}$ of the cell that is being interrogated by a battery management system. According to some example embodiments, the measurement and monitoring of the impedance phase shift based on impedance measurements can have the advantage of being measured in a fast and non-invasive manner. To make the measurements, according to some example embodiments, an electrical connection to the positive and negative terminals of each cell may be required. However, cell evaluation and battery management systems that monitor cell voltages may already include such connections to the each of the terminals for the purpose of monitoring per cell voltage. As such, these connections may be repurposed and leveraged to perform impedance measurements including the impedance phase shift. Additionally, the size of a cell evaluation or battery management system that includes an impedance phase meter configured to measure the impedance phase shift, according to some example embodiments, may add minimal relative size to the apparatus (e.g., a few inches square) and may operate on low power such as, for example, less than 5 Watts.

In this regard, with reference to FIG. 9, a system 900 may comprise a battery cell evaluation apparatus 910 and a battery 980. The battery cell evaluation apparatus 910 may include or embody a battery management system as described above. The battery 980 may be comprised of one or more cells 981, 982, and 983, which may be Li-ion cells.

The battery cell evaluation apparatus 910 may be configured to perform various diagnostic and forensic analyses of cells 981, 982, and 983, in addition to performing electrical and thermal management of the cells 981, 982, and 983. According to some example embodiments, the evaluations performed on the cells 981, 982, and 983 can be used to determine a condition of a cell with respect to, for example, a thermal runaway process by measuring the impedance phase shift.

To evaluate cells 981, 982, and 983, according to some example embodiments, a perturbation current (or voltage) may be applied to each of the cells on an individual basis to facilitate taking measurements (e.g., impedance phase shift) across the terminals 985 of each of the cells 981, 982, and 983. In this regard, the battery cell evaluation apparatus 910 may be configured to evaluate individual cells of an assembled battery, where the cells are electrically connected. According to some example embodiments, the battery cell evaluation apparatus 910 may be connected to the battery 980, which may be already installed as a power source to an electronic device (e.g., an electric vehicle, a power tool, a computer, a building or facility that requires a battery backup power supply to, for example, support an uninterrupted power supply, or the like). In this regard, the battery cell evaluation apparatus 910 may be configured to apply a perturbation current and perform per-cell measurements.

If measurements of the cells satisfy a protection profile as described further herein, then operation of the electronic device with the battery 980 as a power source may be permitted by the battery cell evaluation apparatus 910. If, however, measurements of the cells do not satisfy a protection profile, then operation of the electronic device with the battery as a power source may be prevented or an alert may be provided. As such, the battery cell evaluation apparatus 910 may be leveraged to perform per-cell diagnostic analyses that facilitate diagnosing cells with respect to, for example, potential thermal runaway.

In view of the forgoing, FIG. 9 illustrates system 900 configured to perform cell evaluation to assess condition of cells 981, 982, and 983, according to some example embodiments. Specifically, FIG. 9 illustrates system 900 including battery cell evaluation apparatus 910 that may be configured to operate as, for example, an impedance-based battery cell evaluation system. The cells 981, 982, and 983 may be electrochemical cells with external connectors or terminals that facilitate connecting the battery cells 981, 982, and 983 to the battery cell evaluation apparatus 910. The cells 981, 982, and 983 may be formed using chemistries, including lithium-ion or lithium-polymer.

In the configuration shown in FIG. 9, the battery cell evaluation apparatus 910 may be configured to be removable from operable connection to the battery cells 981, 982, and 983. The battery cell evaluation apparatus 910 is shown in FIG. 9 as being operably coupled to the battery cells 981, 982, and 983, via the terminals 985 of the cells. The battery cells 981, 982, and 983 may be connected to each other (as indicated by the dotted lines in FIG. 9 between the battery cells 981, 982, and 983) within the battery 980. Such electrical connections may be formed in a variety of ways, including welds. The battery 980 may be a multi-cell battery where the cells may be connected in series, parallel, or combinations thereof.

According to some example embodiments, the battery cell evaluation apparatus 910 may comprise control circuitry 920, a current source 930, a current multiplexer 940, a measurement multiplexer 950, and measurement circuitry 960. The control circuitry 920 may be configured to control and communicate (via signals) with the current source 930, the current multiplexer 940, the measurement multiplexer 950, and the measurement circuitry 960. In general, the control circuitry 920 may be a single integrated circuit comprising processing circuitry 922 with one or more processors 924 (or processor cores) and memory 926. The control circuitry 920 may also include programmable input/output peripherals, such as a user interface 928 and a communications interface 927.

As a component of the control circuitry 920, the processing circuitry 922 may be in operative communication with the current source 930, the current multiplexer 940, the measurement multiplexer 950, and the measurement circuitry 960. The processing circuitry 922, in some example embodiments, may be in communication with the communications interface 927 and the user interface 928. The processing circuitry 922 may interact with or embody the memory 926 and the processor 924. The processing circuitry 922 may be configurable to perform various operations as described herein. In this regard, the processing circuitry 922 may be configured to perform computational processing and memory management according to some example embodiments to facilitate performing various functionalities of the control circuitry 920 and processing circuitry 922 described herein. In some embodiments, the processing circuitry 922 may be embodied as a chip or chip set. In other words, the processing circuitry 922 may comprise one or more physical packages (e.g., chips) including materials, components or wires on a structural assembly (e.g., a baseboard). The processing circuitry 922 may be embodied as a circuit chip (e.g., an integrated circuit chip, such as a field programmable gate array (FPGA)) configured (e.g., with hardware, software or a combination of hardware and software) to perform operations described herein. The processing circuitry 922 may be configured to receive inputs, for example, from the communications interface 927, the user interface 928, or the measurement circuitry 960 and perform actions based on the inputs, and generate outputs. Further, in some example embodiments, the processing circuitry 922 may be a configuration of components including some analog components. In this regard, for example, in-band measurements may be made using analog band-pass filters in operation with an integrator (e.g., a leaky integrator). Further, operational amplifiers and other passive components, such as resistors and capacitors, may also be included to support the operation and functionalities performed by the processing circuitry 922 as described herein. As such, the processing circuitry 922 may be configured to perform signal conditioning and processing using either analog or digital techniques.

In some example embodiments, the memory 926 may include one or more non-transitory memory devices such as, for example, volatile or non-volatile memory that may be either fixed or removable. The memory 926 may be configured to store information, data, applications, instructions or the like for enabling, for example, execution of procedures and the like to carry out various functions in accordance with example embodiments. For example, the memory 926 could be configured to buffer input data for processing by the processing circuitry 922. Additionally or alternatively, the memory 926 could be configured to store instructions for execution by the processing circuitry 922. Among the contents of the memory, applications may be stored for execution by the processing circuitry 922 in order to carry out the functionality associated with each respective application.

According to some example embodiments, the processing circuitry 922 may be configured to execute instructions stored in the memory 926 or otherwise accessible to the processing circuitry 922. As such, whether configured by hardware or by a combination of hardware and software, the processing circuitry 922 may represent an entity (e.g., physically embodied in circuitry—in the form of processing circuitry 922) capable of performing operations according to example embodiments while configured accordingly. Thus, for example, when the processing circuitry 922 is embodied as an ASIC, FPGA, or the like, the processing circuitry 922 may be specifically configured hardware for conducting the operations described herein. Alternatively, as another example, when the processing circuitry 922 is embodied as an executor of software instructions, the instructions may specifically configure the processing circuitry 922 to perform the operations described herein.

The communications interface 927 may include one or more interface mechanisms for enabling communication with other devices external to cell evaluation apparatus 910, via, for example, a network, such as a local area network. In some cases, the communication interface 927 may be any means such as a device or circuitry embodied in either hardware, or a combination of hardware and software that is configured to receive or transmit data from/to devices in communication with the control circuitry 920. The communications interface 927 may be a wired or wireless interface and may support various communications protocols. Communications interface 927 may be operably coupled to an antenna to support wireless communications to other components. In this regard, the communications interface 927 and the antenna may support communications via, for example, Bluetooth or WIFI connections. According to some example embodiments, the communications interface 927 may include components and configurations to support communications via universal serial bus (USB) connection. The communications interface 927 may be configured to provide a communication mechanism for external systems (such as a laptop) to the control circuitry 920, for example, to enable viewing of the measurement information and/or programming of the control circuitry 920.

The user interface 928 may be controlled by the control circuitry 920 and the processing circuitry 922 to interact with a user. In this regard, via the user interface 928, the processing circuitry 922 may be configured to output information to a user via an output device such as, for example, driving a display (e.g., in the form of a collection of indicator lights or light emitting diodes (LEDs)) or an audio device (e.g., a speaker) and receive information input from a user via an input device such as, for example, a keyboard, mouse, touch screen, or the like. According to some example embodiments, the user interface 928 may comprise status LEDs to provide status information to a user. In this regard, the status LEDs can provide a visual indication of the operations of the battery cell evaluation apparatus 910, such as power on, power off, measuring, selecting cell, charging, or the like.

Additionally, the current source 930 may be an electronic circuit that delivers an electric current, such as an alternating current (AC) at one or more frequencies to facilitate measurements of the cells 981, 982, and 983 at one or more desired frequencies. In this regard, the current may be provided as a perturbation current to excite the cells 981, 982, and 983 and to facilitate obtaining measurements at a desired frequency for each cell as described herein. The control circuitry 920 may be configured to control the operation of the current source 930 and the output of the current source 930. In this regard, the control circuitry 920 may control the current source 930 to output a current at a desired frequency that is associated with the type of measurement to be taken at that frequency. The current source 930 may be controlled by the processing circuitry 922 to output, for example, a current with a frequency between approximately 1 Hz to 5 Hz or 1 Hz to 10 Hz. According to some example embodiments, a current with a frequency of 5 Hz may be utilized. Further, according to some example embodiments, other frequencies may be used, such as, for example, frequencies ranging from 10 Hz to 10,000 kHz. Additionally, the amplitude of the perturbation current provided by the current source 930 may be sufficiently small to prevent higher harmonic generation in the cells 981, 982, and 983. In this regard, according to some example embodiments, the perturbation current may be provided such that less than 5-mV is applied to the terminals of a cell in order to be within a linear polarization regime to maintain data accuracy.

According to some example embodiments, the current multiplexer 940 may be a device that can be controlled by the control circuitry 920 to electrically connect the current source 930 to a selected cell. As such, the current multiplexer 940 may be in a configuration where a single input of the current multiplexer 940 is electrically connected to the current source 930 and each of the outputs of the current multiplexer 940 are electrically connected to a respective one of the battery cells (i.e., a demultiplexing configuration). In operation, the current multiplexer 940 may be controlled by the control circuitry 920 by providing signals on the select lines 941 of the current multiplexer 940 to cause the current multiplexer 940 to electrically connect, internal to the current multiplexer 940, the current source 930 to a selected cell. For example, if the current multiplexer 940 has two select lines 941, then the current source 930 can be electrically connected to four different battery cells. In this example, the control circuitry 920 may provide signals on the two select lines 941 of 0 and 0 (e.g., low voltage and low voltage) respectively to electrically connect the current source 930 to a first battery cell; 0 and 1 (e.g., low voltage and high voltage) respectively to electrically connect the current source 930 to a second battery cell; 1 and 0 (e.g., high voltage and low voltage) respectively to electrically connect the current source 930 to a third battery cell; and 1 and 1 (e.g., high voltage and high voltage) respectively to electrically connect the current source 930 to a fourth battery cell. As such, the current multiplexer 940, which may be embodied as an integrated circuit chip, may operate as a selector switch that electrically connects the current source 930 to a selected battery cell to permit the current source 930 to apply a perturbation current at a desired frequency to the selected cell. Upon controlling the current multiplexer 940 to connect the current source 930 to a selected cell, the measurement multiplexer 950 and the measurement circuitry 960 may be in a configuration to begin performing measurements on the selected cell in coordination with the timing for when perturbation currents at a desired frequency are provided by the current source 930.

As such, the current multiplexer 940 may be operably coupled to the control circuitry 920 to permit the control circuitry 920 to control the outputs of the current multiplexer 940 that may be operably coupled, respectively, to the cells 981, 982, and 983. In this regard, the control circuitry 920 may control select lines 941 of the current multiplexer 940 to electrically connect the current source 930 to a selected battery cell and thereby apply a current at the output of the current source 930 to the selected battery cell through the current multiplexer 940.

Similarly, the measurement multiplexer 950 may be a device that can be controlled by the control circuitry 920 to electrically connect the measurement circuitry 960 to a selected cell. As such, the measurement multiplexer 950 may be in a configuration where each of the inputs of the measurement multiplexer 950 are electrically connected to a respective cell and the single output of the measurement multiplexer 950 is electrically connected to the measurement circuitry 960 (i.e., a multiplexing configuration). The control circuitry 920 may control select lines 951 of the measurement multiplexer 950 to cause the measurement multiplexer 950 to electrically connect, internal to the measurement multiplexer 950, a selected battery cell to the measurement circuitry 960. For example, if the measurement multiplexer 950 has two select lines 951, then four different battery cells can be electrically connected to the measurement circuitry 960. In this example, the control circuitry 920 may provide signals on the two select lines 951 of 0 and 0 (e.g., low voltage and low voltage) respectively to electrically connect the measurement circuitry 960 to a first battery cell; 0 and 1 (e.g., low voltage and high voltage) respectively to electrically connect the measurement circuitry 960 to a second battery cell; 1 and 0 (e.g., high voltage and low voltage) respectively to electrically connect the measurement circuitry 960 to a third battery cell; and 1 and 1 (e.g., high voltage and high voltage) respectively to electrically connect the measurement circuitry 960 to a fourth battery cell. As such, the measurement multiplexer 950, which may be embodied as an integrated circuit chip, may operate as a selector switch that electrically connects the measurement circuitry 960 to a selected battery cell to permit the measurement circuitry 960 to perform measurements on the selected battery cell. Upon controlling the measurement multiplexer 950 to connect to a selected battery cell, the measurement multiplexer 950 and the measurement circuitry 960 may be in a configuration to begin performing measurements on the selected battery cell in coordination with the timing for when perturbation currents provided by the current source 930 according to a desired frequency is provided.

As such, the measurement multiplexer 950 may be operably coupled to the control circuitry 920 to permit the control circuitry 920 to control which input of the measurement multiplexer 950, and thus which cell 981, 982, and 983, is electrically connected to the measurement circuitry 960 through the measurement multiplexer 950. The control circuitry 920 may control select lines 951 of the measurement multiplexer 950 to connect the measurement circuitry 960 to the selected cell and facilitate performing measurements of the selected cell. As such, the control circuitry 920 may control the operation of both the current multiplexer 940 and the measurement multiplexer 950 in a coordinated manner such that the current source 930 and the measurement circuitry 960 are connected to the same selected battery cell at the same time in order to apply a perturbation current at a given frequency from the current source 930 to the selected battery cell and also perform measurements on the selected battery cell by the measurement circuitry 960.

The measurement circuitry 960 may include a set of measuring instruments or components, such as gain circuits, root means squared (RMS) converters, or the like, which may be configured to take measurements of a selected battery cell within the plurality of cells. For example, the measurement circuitry 960 may comprise a buffer 961, a gain circuit 962, an RMS converter 963, and a gain circuit 964. The gain circuits 962 and 964 may be configured to increase the amplitude of a signal received from the measurement multiplexer 950 via the buffer 961. The RMS converter 963 may be configured to convert the signal received from the measurement multiplexer 950, in the form of an alternating current signal, into a corresponding direct current signal for provision to the control circuitry 920. The buffer 961 (also referred to as a buffer amplifier) may be configured to provide an electrical impedance transformation from the selected cell to the control circuitry 920, the gain circuits 962, 964, and the RMS converter 963. Accordingly, the gain circuit 962, the RMS converter 963, and the gain circuit 964 may operate in coordination to take impedance measurements of a cell including impedance amplitude and impedance phase shift measurements. Further, according to some example embodiments, cell voltage measurements may also be taken by the measurement circuitry 960. According to some example embodiments, the measurements may be taken at certain times when a perturbation current of a desired frequency is provided to the battery cell being measured.

Accordingly, the gain circuit 962, the RMS converter 963, and the gain circuit 964 may operate in coordination to take impedance measurements of a cell, including impedance amplitude and impedance phase shift measurements. In this regard, the measurement circuitry 960 may be configured to measure the impedance phase shift between the current applied to a cell and a voltage across the terminals of the cell at the frequency provided by the current source 930. As such, the measurement circuitry 960 may be configured to operate as a single frequency phase meter configured to determine the impedance phase shift of a cell being interrogated. Further, according to some example embodiments, the measurement circuitry 960 may be configured to operate in the frequency domain at 1 Hz to 5 Hz to facilitate high speed measurements of the cells.

According to some example embodiments, the control circuitry 920 may be configured to perform various operations that may lead to triggering a protection to prevent damage to the battery 980. In this regard, the control circuitry 920 may be configured to electrically connect a cell 981, 982, or 983 of the battery 980 to the current source 930 and the measurement circuitry 960 to apply a current across terminals 985 of the cell 981, 982, or 983. Additionally, the control circuitry 920 may be configured to receive a measurement of the impedance phase shift of the cell 981, 982, or 983 as phase shift data from the measurement circuitry 960. In this regard, the measurement circuitry 960 may be configured to measure, due to application of the current, the impedance phase shift between the current and a voltage across the terminals 985 of the cell 981, 982, or 983 at the frequency. Further, the control circuitry 920 may be configured to compare the phase shift data to a protection profile, and trigger a protection device to prevent damage to the battery 980 based on the comparison of the phase shift data with the protection profile.

According to some example embodiments, the frequency, for example, of the current may be between 1 Hz and 10 Hz or 5 Hz. Further, the protection device may be or include a battery isolation switch configured to isolate the cell or the battery from a load in response to being triggered, or a cooling device configured to reduce a temperature of the cell or the battery in response to being triggered.

According to some example embodiments, the control circuitry 920 may be additionally configured to receive repeated measurements of impedance phase shift over time for each cell from the measurement circuitry 960 for inclusion in the phase shift data. In this regard, the control circuitry 920 may be further configured to trigger the protection device based on the comparison of the phase shift data with the protection profile. In this regard, the protection profile may comprise a threshold slope of impedance phase shift with respect to time. According to some example embodiments, the protection profile may additionally or alternatively comprise a threshold impedance phase shift value for a defined period of time. The comparison of the phase shift data may include a measured impedance phase shift slope based on the phase shift data being compared to the threshold slope of the protection profile. Further, the comparison of the phase shift data may include a measured impedance phase shift value for the defined period of time based on the phase shift data being compared to the threshold impedance phase shift value for the defined period of time of the protection profile.

According to some example embodiments, a magnitude of the threshold slope may be at least one degree of impedance phase shift per twenty-five seconds. Further, according to some example embodiments, the threshold impedance phase shift value has a magnitude of one impedance phase shift degree and the defined period of time is at least twenty-five seconds. Additionally or alternatively, the threshold slope of impedance phase shift with respect to time may be during cell charging or the threshold impedance phase shift value for the defined period of time may be during cell charging.

Further, according to some example embodiments, repeated measurements may be taken from different cells. In an example scenario with the three cells 981, 982, and 983, the control circuitry 920 may select cell 981 as the first selected cell for evaluation. Accordingly, the control circuitry 920 may provide signals to select lines 951 of the measurement multiplexer 950 to cause the measurement multiplexer 950 to electrically connect battery cell 981 to the measurement circuitry 960 through the measurement multiplexer 950. The control circuitry 920 may also provide signals to select lines 941 of the current multiplexer 940 to cause the current multiplexer 940 to electrically connect battery cell 981 to the current source 930 through the current multiplexer 940. With the electrical connections in place through the multiplexers 940 and 950, the control circuitry 920 may control the current source 930 to provide a perturbation current at a desired frequency and the control circuitry 920 may control the measurement circuitry 960 to perform an impedance phase shift measurement of the cell 981 with the first perturbation current applied. The measurement circuitry 960 may provide the measurement to the control circuitry 920 for storage and analysis.

Subsequently, the control circuitry 920 may select cell 982 as the second selected cell for evaluation. Accordingly, the control circuitry 920 may provide signals to select lines 951 of the measurement multiplexer 950 to cause the measurement multiplexer 950 to electrically connect battery cell 982 to the measurement circuitry 960 through the measurement multiplexer 950. The control circuitry 920 may also provide signals to select lines 941 of the current multiplexer 940 to cause the current multiplexer 940 to electrically connect cell 982 to the current source 930 through the current multiplexer 940. With the electrical connections in place through the multiplexers 940 and 950, the control circuitry 920 may control the current source 930 to provide a perturbation current at a desired frequency and the control circuitry 920 may control the measurement circuitry 960 to perform an impedance phase shift measurement of the cell 982 with the perturbation current applied. Similar to the above, the control circuitry 920 may receive the measurement of the battery cell 982 for storage and analysis. Subsequently, the cell 983 may be selected and a similar process may be performed for the cell 983.

FIG. 10 provides another example system 1000 that comprises the battery cell evaluation apparatus 910. However, in contrast to FIG. 9, the system 1000 shows the battery 980 installed within an electronic device 1010 to operate as a power source for the electronic device 1010. The electronic device 1010 may be any type of device that requires electric power to operate and may use the battery 980 as a source of electric power. As such, electronic device 1010 may be, for example, an electric vehicle, a power tool, a computer, a building or facility that requires a battery backup power supply to, for example, support an uninterrupted power supply, or the like. As such, the electronic device 1010 may at least include an electrical load, such as load 1018. However, the electronic device 1010 may also include, for example, a charger 1012, a charger control 1014, and a load control 1016. According to some example embodiments, the electronic device 1010 may also include a protection device 1020.

The charger 1012 and the charger control 1014 may be components of a battery charging apparatus. The charger 1012 may be a device that may be operably coupled to an external power source to facilitate delivery of electric power to the battery 980 to recharge the battery 980. The charger 1012 may include electronics (e.g., a switching power supply) to, for example, convert alternating current into direct current for direct current battery charging. The charger control 1014 may be a device that may be operably coupled to charger 1012 and the battery 980 to monitor and control the battery charging process. In this regard, the charger control 1014 may include electronics configured to measure the current being supplied to the battery 980 during charging and, for example, discontinue charging when the current reaches a threshold level indicating that charging is complete. The charger control 1014 may therefore include an internal, controllable switch to discontinue charging.

As mentioned above, the load 1018 may be any type of electrical load and the load control 1016 may be a device configured to control the load 1018 and the power being delivered to the load 1018. In this regard, the load control 1016 may include electronics configured to measure the current being supplied to the load 1018 or a temperature of a component of the load 1018. The load control 1016 may be configured to interrupt current to the load 1018 if an overcurrent or overtemperature condition arises. In this regard, the load control 1016 may include an internal, controllable switch or may be configured to operate the protection device 1020 to, for example, open an isolation switch of the protection device 1020, if such a condition arises.

As such, according to some example embodiments, the protection device 1020 may be or include a cell or battery isolation switch, which may be a controllable switch (e.g., relay) that is capable of interrupting current being delivered by the battery 980 to the load 1018. In this regard, the battery isolation switch may be controllable by a number of systems, including the battery cell evaluation apparatus 910 as further described below.

The battery cell evaluation apparatus 910, with the control circuitry 920, may be configured to perform protective actions with respect to the battery 980 and the cells 981, 982, and 983 to prevent damage to the battery 980 or the electronic device 1010 due to, for example, thermal runaway. To do so, according to some example embodiments, the battery cell evaluation apparatus 910 may be permanently affixed to the electronic device 1010 of the battery 980, and may be configured to operate as described above with respect to FIG. 9 to control the protection device 1020. In this regard, when the battery cell evaluation apparatus 910 triggers the protection device 1020 a protective action may take place, depending, for example, on the type of protection device 1020.

According to some example embodiments, as mentioned above, the protection device 1020 may be or include an interrupt switch. In this regard, for example, one or more interrupt switches may be included in the protection device 1020, with an interrupt switch connected to each of the cells 981, 982, and 983. In this regard, if the protection device 1020 is triggered based on an impedance phase shift measurement of a particular cell, the interrupt switch for that cell may be opened to isolate the cell and prevent progression toward thermal runaway. Alternatively, the protection device 1020 may include a single interrupt switch for the battery 980, and when the protection device 1020 is triggered, the single interrupt switch may be opened to isolate the entire battery from the load 1018. Further, according to some example embodiments, the protection device 1020 may be or include a rapid cooling device, such as, for example, a fan, radiator, air or fluid conditioner, or the like. In this regard, when the protection device 1020 is triggered, cooling of the battery 980 or a cell 981, 982, or 983 may be initiated in an effort to cool the cell or the battery to avoid thermal runaway or interrupt thermal runaway conditions.

Figure 11:
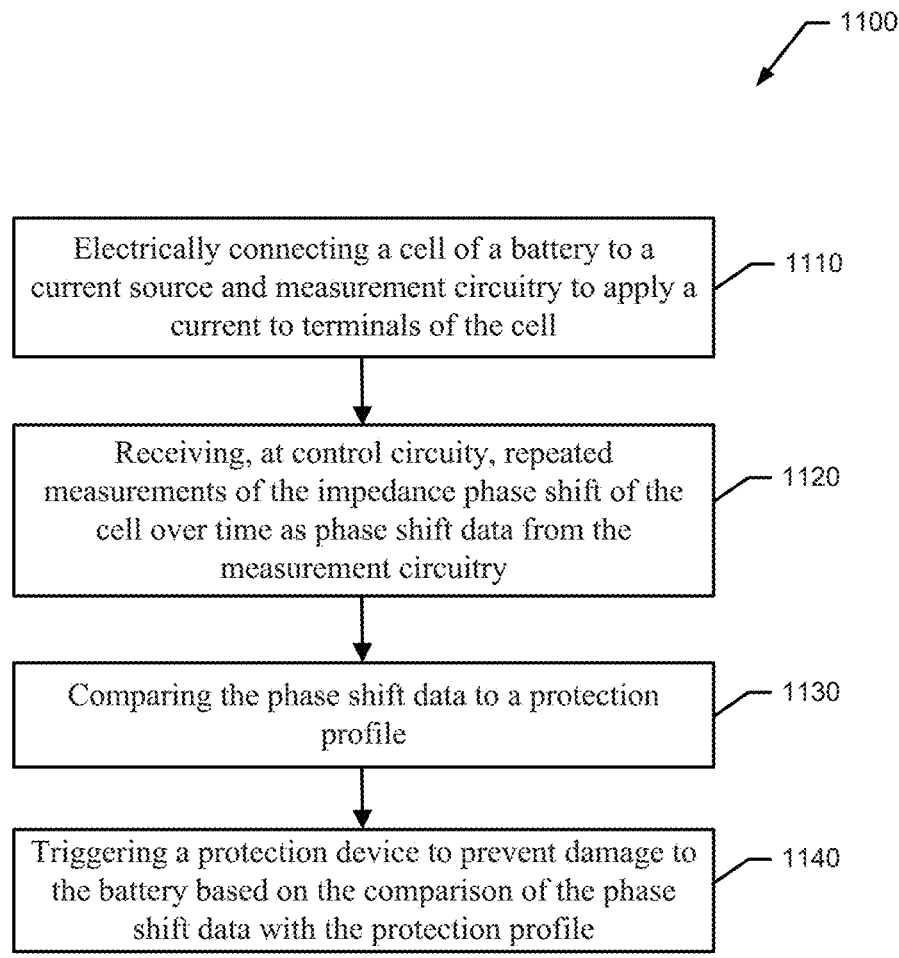
FIG. 11 illustrates a method for triggering a protection device based on impedance phase shift measurements according to some example embodiments.

FIG. 11 illustrates flowchart 1100 of an example method for taking a protective action in response to an impedance phase shift measurement. In this regard, the example method includes, at 1110, electrically connecting a cell of a battery to a current source and measurement circuitry to apply a current to terminals of the cell. Further, at 1120, the example method includes receiving, at control circuitry, repeated measurements of the impedance phase shift of the cell over time as phase shift data from the measurement circuitry. In this regard, the measurement circuitry may be configured to measure, due to application of the current, the impedance phase shift between the current and a voltage across the terminals of the cell. At 1130, the example method may further include comparing the phase shift data to a protection profile. Also, at 1140, the example method may include triggering a protection device to prevent damage to the battery based on the comparison of the phase shift data with the protection profile.

Additionally, according to some example embodiments, triggering the protection device based on the comparison of the phase shift data with the protection profile may include the protection profile comprising a threshold slope of impedance phase shift with respect to time. Accordingly, the comparison of the phase shift data may include a measured impedance phase shift slope based on the phase shift data that is being compared to the threshold slope. Additionally or alternatively, according to some example embodiments, triggering the protection device based on the comparison of the phase shift data with the protection profile may include the protection profile comprising a threshold impedance phase shift value for a defined period of time. Accordingly, the comparison of the phase shift data may include a measured impedance phase shift value for the defined period of time based on the phase shift data being compared to the threshold impedance phase shift value for the defined period of time.

Some of the operations indicated in the flowchart 1100 (e.g., comparing phase shift data) may be implemented by various means, such as hardware, firmware, processor, circuitry and/or other device associated with execution of software including one or more computer program instructions. For example, one or more of the procedures described above may be embodied by computer program instructions. In this regard, the computer program instructions which embody the procedures described above may be stored by a memory device executed by a processor of processing circuitry. As will be appreciated, any such computer program instructions may be loaded onto a computer or other programmable apparatus (e.g., hardware) to produce a machine, such that the instructions which execute on the computer or other programmable apparatus create means for implementing the functions specified in the flowchart block(s). These computer program instructions may also be stored in a computer-readable memory that may direct a computer or other programmable apparatus to function in a particular manner, such that the instructions stored in the computer-readable memory produce an article of manufacture which implements the functions specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s).

Accordingly, blocks of the flowchart support combinations of means for performing the specified functions and combinations of operations for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

Many modifications and other example embodiments in addition to those set forth herein will come to mind to one skilled in the art to which these embodiments pertain having the benefit of the teachings presented in the foregoing descriptions and the associated drawings. Therefore, it is to be understood that the embodiments are not to be limited to those disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A battery cell evaluation apparatus comprising:
    a current source configured to output a current at a frequency;
    measurement circuitry; and
    control circuitry configured to:
        electrically connect a cell of a battery to the current source and the measurement circuitry to apply the current across terminals of the cell;
        receive a measurement of an impedance phase shift of the cell as phase shift data from the measurement circuitry, the measurement circuitry being configured to measure, due to application of the current, the impedance phase shift between the current and a voltage across the terminals of the cell at the frequency;
        compare the phase shift data to a protection profile, the protection profile comprising a threshold slope of impedance shift with respect to time or a threshold impedance shift value for a defined period of time; and
        trigger a protection device to prevent damage to the battery based on the comparison of the phase shift data to the protection profile.

2. The battery cell evaluation apparatus of claim 1, wherein the control circuitry is further configured to receive repeated measurements of impedance phase shift over time for inclusion in the phase shift data.

3. The battery cell evaluation apparatus of claim 2, wherein the protection profile comprises the threshold slope of impedance phase shift with respect to time; and
    wherein the control circuitry is configured to compare the phase shift data by comparing a measured impedance phase shift slope based on the phase shift data to the threshold slope.

4. The battery cell evaluation apparatus of claim 3, wherein a magnitude of the threshold slope is less than one degree of impedance phase shift per twenty-five seconds.

5. The battery cell evaluation apparatus of claim 3, wherein the threshold slope of impedance phase shift with respect to time is during cell charging.

6. The battery cell evaluation apparatus of claim 2, wherein the protection profile comprises the threshold impedance phase shift value for the defined period of time;
    wherein the control circuitry is configured to compare the phase shift data by comparing a measured impedance phase shift value for the defined period of time based on the phase shift data to the threshold impedance phase shift value for the defined period of time.

7. The battery cell evaluation apparatus of claim 6, wherein the threshold impedance phase shift value has a magnitude of less than one degree of impedance phase shift and the defined period of time is at least twenty-five seconds.

8. The battery cell evaluation apparatus of claim 6, wherein the threshold impedance phase shift value for the defined period of time is during cell charging.

9. The battery cell evaluation apparatus of claim 2, wherein the control circuitry is further configured to trigger the protection device based on the comparison of the phase shift data with the protection profile, the protection profile comprising:
  the threshold slope of impedance phase shift with respect to time, and
  the threshold impedance phase shift value for the defined period of time;
  wherein the control circuitry is configured to compare the phase shift data by comparing a measured impedance phase shift slope based on the phase shift data to the threshold slope and comparing a measured impedance phase shift value for the defined period of time based on the phase shift data to the threshold impedance phase shift value for the defined period of time.

10. The battery cell evaluation apparatus of claim 9, wherein a magnitude of the threshold slope is at least one degree of impedance phase shift per twenty-five seconds and the threshold impedance phase shift value has a magnitude of one impedance phase shift degree and the defined period of time is at least twenty-five seconds.

11. The battery cell evaluation apparatus of claim 1, wherein the frequency is between 1 Hz and 10 Hz.

12. The battery cell evaluation apparatus of claim 1, wherein the protection device is a battery isolation switch configured to isolate the cell or the battery from a load in response to being triggered or a cooling device configured to reduce a temperature of the cell or the battery in response to being triggered.

13. A system comprising:
  a battery comprising a cell within a plurality of cells;
  a battery cell evaluation apparatus comprising:
    a current source configured to output a current;
    measurement circuitry; and
    control circuitry configured to:
      electrically connect the cell of the battery to the current source and the measurement circuitry to apply the current across terminals of the cell;
      receive a measurement of an impedance phase shift of the cell as phase shift data from the measurement circuitry, the measurement circuitry being configured to measure, due to application of the current, the impedance phase shift between the current and a voltage across the terminals of the cell;
      compare the phase shift data to a protection profile, the protection profile comprising a threshold slope of impedance shift with respect to time or a threshold impedance shift value for a defined period of time; and
      trigger a protection device to prevent damage to the battery based on the comparison of the phase shift data to the protection profile.

14. The system of claim 13, wherein the control circuitry is further configured to receive repeated measurements of impedance phase shift over time for inclusion in the phase shift data.

15. The system of claim 14, wherein the protection profile comprises the threshold slope of impedance phase shift with respect to time; and
  wherein the control circuitry is configured to compare the phase shift data by comparing a measured impedance phase shift slope based on the phase shift data to the threshold slope.

16. The system of claim 14, wherein the protection profile comprises the threshold impedance phase shift value for the defined period of time;
  wherein the control circuitry is configured to compare the phase shift data by comparing a measured impedance phase shift value for the defined period of time based on the phase shift data to the threshold impedance phase shift value for the defined period of time.

17. The system of claim 13, further comprising the protection device, wherein the protection device is a battery isolation switch configured to isolate the cell or the battery from a load in response to being triggered or a cooling device configured to reduce a temperature of the cell or the battery in response to being triggered.

18. A method comprising:
  electrically connecting a cell of a battery to a current source and measurement circuitry to apply a current across terminals of the cell;
  receiving, at control circuitry, repeated measurements of an impedance phase shift of the cell over time as phase shift data from the measurement circuitry, the measurement circuitry being configured to measure, due to application of the current, the impedance phase shift between the current and a voltage across the terminals of the cell;
  comparing the phase shift data to a protection profile, the protection profile comprising a threshold slope of impedance shift with respect to time or a threshold impedance shift value for a defined period of time; and
  triggering a protection device to prevent damage to the battery based on the comparison of the phase shift data to the protection profile.

19. The method of claim 18, wherein the protection profile comprises the threshold slope of impedance phase shift with respect to time; and
  wherein comparing the phase shift data includes comparing a measured impedance phase shift slope based on the phase shift data to the threshold slope.

20. The method of claim 18, wherein the protection profile comprises the threshold impedance phase shift value for the defined period of time;
  wherein the control circuitry is configured to compare the phase shift data by comparing measured impedance phase shift value for the defined period of time based on the phase shift data to the threshold impedance phase shift value for the defined period of time.

* * * * *